(12) United States Patent
Kim et al.

(10) Patent No.: US 12,020,502 B2
(45) Date of Patent: Jun. 25, 2024

(54) DISPLAY DEVICE

(71) Applicant: Samsung Display Co., Ltd., Yongin-Si (KR)

(72) Inventors: Sunghwan Kim, Yongin-si (KR); Hyunae Park, Hwaseong-si (KR); Seowon Choe, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/121,205

(22) Filed: Mar. 14, 2023

(65) Prior Publication Data

US 2023/0316801 A1   Oct. 5, 2023

(30) Foreign Application Priority Data

Mar. 29, 2022 (KR) .......................... 10-2022-0038601

(51) Int. Cl.
| | |
|---|---|
| *G06V 40/13* | (2022.01) |
| *G09G 3/3233* | (2016.01) |
| *G09G 3/3258* | (2016.01) |
| *H10K 59/131* | (2023.01) |

(52) U.S. Cl.
CPC ....... *G06V 40/1318* (2022.01); *G09G 3/3233* (2013.01); *G09G 3/3258* (2013.01); *H10K 59/131* (2023.02); *G09G 2300/0408* (2013.01); *G09G 2300/0413* (2013.01); *G09G 2300/0452* (2013.01); *G09G 2300/0842* (2013.01); *G09G 2300/0861* (2013.01); *G09G 2354/00* (2013.01)

(58) Field of Classification Search
None
See application file for complete search history.

(56) References Cited

U.S. PATENT DOCUMENTS

| | | | |
|---|---|---|---|
| 9,836,165 B2 | 12/2017 | Nho et al. | |
| 10,534,951 B2 | 1/2020 | Xu et al. | |
| 10,572,043 B2 | 2/2020 | Kim et al. | |
| 10,622,415 B2 | 4/2020 | Xu et al. | |
| 10,679,567 B2 * | 6/2020 | Lee | H10K 77/111 |
| 11,043,516 B2 * | 6/2021 | Oh | G09G 3/3258 |
| 2018/0331124 A1 * | 11/2018 | Cho | H10K 59/126 |
| 2019/0164999 A1 * | 5/2019 | Choi | G02F 1/136209 |
| 2020/0226983 A1 * | 7/2020 | Lee | G09G 3/3291 |
| 2021/0013290 A1 * | 1/2021 | Park | H01L 27/1255 |
| 2021/0035496 A1 * | 2/2021 | Cho | G09G 3/3225 |
| 2021/0375215 A1 | 12/2021 | Cho et al. | |
| 2022/0344625 A1 * | 10/2022 | Jeon | H10K 59/126 |

FOREIGN PATENT DOCUMENTS

| | | |
|---|---|---|
| KR | 10-2021-0014810 | 2/2021 |
| KR | 10-2021-0148547 | 12/2021 |

\* cited by examiner

*Primary Examiner* — Matthew Yeung
(74) *Attorney, Agent, or Firm* — F. Chau & Associates, LLC

(57) ABSTRACT

A display device includes a base layer. A circuit layer is disposed on the base layer and includes at least one insulating layer and at least one transistor. An element layer is disposed on the circuit layer and includes a light emitting element and a light sensing element. The circuit layer includes a data line connected to the light emitting element and a readout line connected to the light sensing element. The readout line outputs a sensing signal in a sensing section of the display device. The readout line receives a reference voltage in a non-sensing section of the display device.

20 Claims, 17 Drawing Sheets

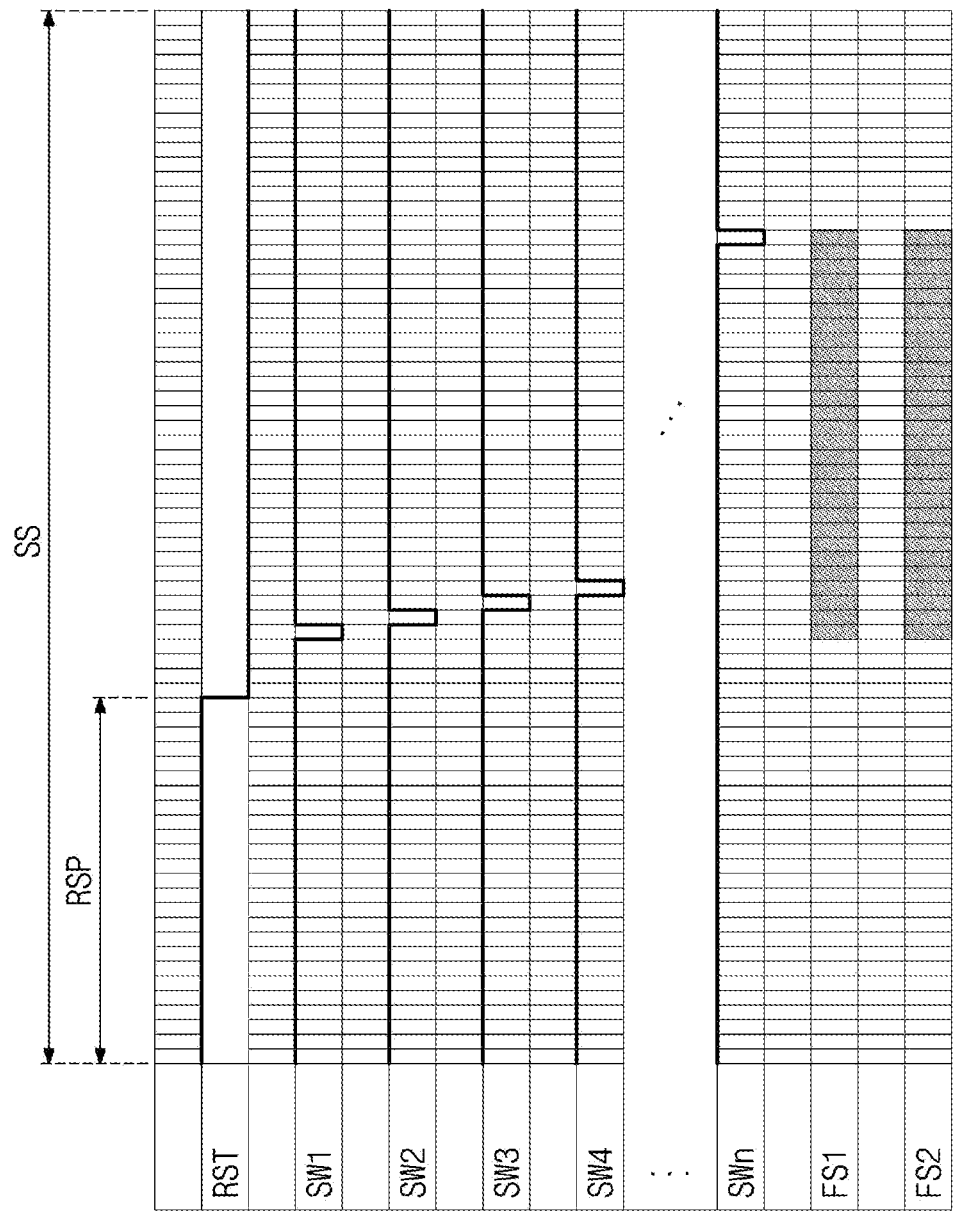

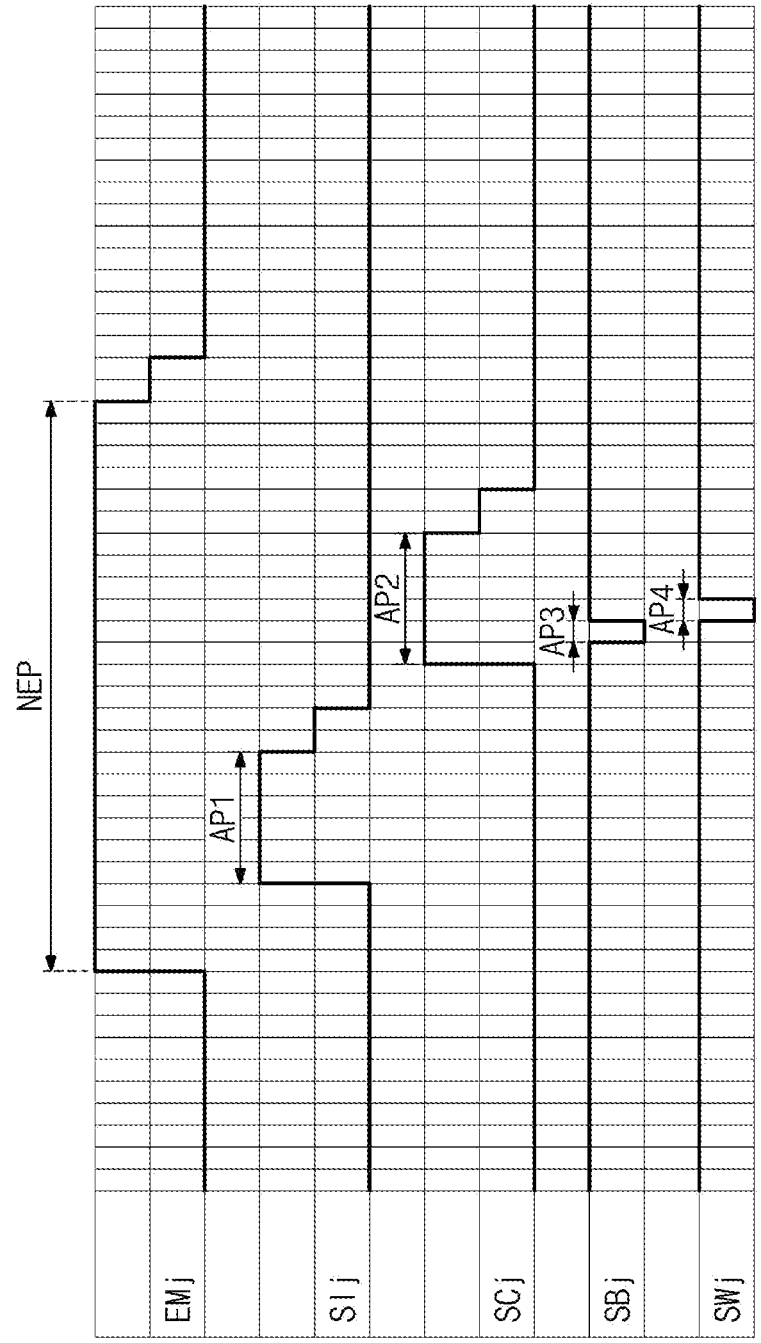

DISPLAY DEVICE

CROSS-REFERENCE TO RELATED APPLICATIONS

This application claims priority under 35 U.S.C. § 119 to Korean Patent Application No. 10-2022-0038601, filed on Mar. 29, 2022 in the Korean Intellectual Property Office, the disclosure of which is incorporated by reference in its entirety herein.

1. TECHNICAL FIELD

Embodiments of the present disclosure described herein relate to a display device, and more particularly, relate to a display device that recognizes biometric information.

2. DISCUSSION OF RELATED ART

A display device provides various functions that enable a user to interact with the display device. For example, the display device may display an image to provide information to the user, or may sense an input of the user. Recently, display devices have been developed that include a function of sensing biometric information of a user.

Biometric information may be recognized by using a capacitive sensing technique for sensing a change in capacitance formed between electrodes, a light sensing technique for sensing incident light using an optical sensor, or an ultrasonic sensing technique for sensing vibration using a piezoelectric element.

SUMMARY

Embodiments of the present disclosure provide a display device for increasing the sensitivity of a sensor for recognition of biometric information while decreasing a dead space of a non-display area.

According to an embodiment of the present disclosure, a display device includes a base layer. A circuit layer is disposed on the base layer and includes at least one insulating layer and at least one transistor. An element layer is disposed on the circuit layer and includes a light emitting element and a light sensing element. The circuit layer includes a data line connected to the light emitting element and a readout line connected to the light sensing element. The readout line outputs a sensing signal in a sensing section of the display device. The readout line receives a reference voltage in a non-sensing section of the display device.

In an embodiment, the display device may further include a readout circuit that is connected with the readout line and that receives the sensing signal in the sensing section, and the readout circuit may include a switching circuit that applies the reference voltage to the readout line in the non-sensing section in response to a control signal.

In an embodiment, the at least one transistor is connected to the light emitting element. A first drive voltage may be applied to the at least one transistor connected to the light emitting element and a second drive voltage having a lower voltage level than the first drive voltage may be applied to the light emitting element and the light sensing element. The reference voltage may be one of the first drive voltage and the second drive voltage.

In an embodiment, the base layer may include a non-bending area, and a first bending area and a second bending area spaced apart from each other in a first direction with the non-bending area positioned therebetween. The circuit layer may include first pads disposed in the first bending area that are exposed by the at least one insulating layer. Second pads are disposed in the second bending area and are exposed by the at least one insulating layer.

In an embodiment, the data line may include a first data line group including n first lines that extend in the first direction and that are spaced apart from each other in a second direction crossing the first direction. N is a natural number. A second data line group includes n second lines that extend in the first direction and that are spaced apart from each other in the second direction. A third data line group is disposed between the first data line group and the second data line group. The third data line group including m third lines that extend in the first direction and that are spaced apart from each other in the second direction. M is a natural number. Bridge lines are connected to corresponding lines among the first lines and the second lines. The first data line group and the second data line group may be connected to corresponding pads among the first pads through the bridge lines, and the third data line group may be directly connected to corresponding pads among the first pads.

In an embodiment, each of the bridge lines may include a first pattern that extends in the first direction and has a first end connected to a corresponding pad among the first pads and a second pattern that extends in the second direction and that is connected to an opposite second end of the first pattern and a corresponding line among the first lines and the second lines.

In an embodiment, the readout line may include a first readout line group including x fourth lines that extend in the first direction and that are alternately arranged with the first lines in the second direction. X is a natural number. A second readout line group includes x fifth lines that extend in the first direction and that are alternately arranged with the second lines in the second direction. A third readout line group including y sixth lines that extend in the first direction and that are alternately arranged with the third lines in the second direction. Y is a natural number. Readout bridge lines are connected to corresponding lines among the fourth lines and the fifth lines. The first readout line group and the second readout line group may be connected to corresponding pads among the second pads through the readout bridge lines. The third readout line group may be directly connected to corresponding pads among the second pads.

In an embodiment, each of the readout bridge lines may include a third pattern that extends in the first direction and has a first end connected to a corresponding pad among the second pads and a fourth pattern that extends in the second direction and that is connected to an opposite second end of the third pattern and a corresponding line among the fourth lines and the fifth lines.

In an embodiment, the third pattern may overlap one of the first lines and the second lines.

In an embodiment, the fourth pattern may cross at least one of the first lines and the second lines and may be disposed on a different layer from the first lines and the second lines.

In an embodiment, the base layer may include a non-bending area and a bending area adjacent to the non-bending area. The circuit layer may include pads disposed in the bending area that are exposed by the at least one insulating layer.

In an embodiment, the data line may include a first data line group including n first lines that extend in a first direction and that are spaced apart from each other in a second direction crossing the first direction. N is a natural number. A second data line group including n second lines that extend in the first direction and that are spaced apart from each other in the second direction. A third data line group is disposed between the first data line group and the second data line group. The third data line group includes m third lines that extend in the first direction and that are spaced apart from each other in the second direction. M is a natural number. Bridge lines are connected to corresponding lines among the first lines and the second lines. The first data line group and the second data line group may be connected to corresponding pads among the pads through the bridge lines. The third data line group may be directly connected to corresponding pads among the pads.

In an embodiment, the readout line may include y sixth lines that extend in the first direction and that are directly connected with corresponding pads among the pads and are alternately arranged with the third lines in the second direction. Y is a natural number.

In an embodiment, the display device may further include dummy lines that extend in the first direction and that are alternately arranged with the first lines and the second lines in the second direction.

In an embodiment, the dummy lines may receive the reference voltage.

In an embodiment, the dummy lines may be disposed on a same layer as the first data line group, the second data line group, the third data line group, and the sixth lines.

In an embodiment, the readout line may further include a first readout line group including x fourth lines that extend in the first direction and that are alternately arranged with the first lines in the second direction. X is a natural number. A second readout line group includes x fifth lines that extend in the first direction and that are alternately arranged with the second lines in the second direction. Readout bridge lines connected to corresponding lines among the fourth lines and the fifth lines.

In an embodiment, each of the readout bridge lines may include a third pattern that extends in the first direction and has a first end connected to a corresponding pad among the pads and a fourth pattern that extends in the second direction and that is connected to an opposite second end of the third pattern and a corresponding line among the fourth lines and the fifth lines.

In an embodiment, the fourth pattern may cross at least one of the first lines and the second lines and may be disposed on a different layer from the first lines and the second lines.

In an embodiment, the circuit layer may further include a sensor drive circuit connected to the light sensing element. The sensor drive circuit may include a reset transistor including a first electrode that receives a reset voltage, a second electrode connected with a first sensing node, and a third electrode that receives a reset control signal, an amplifying transistor including a first electrode that receives a sensor drive voltage, a second electrode connected with a second sensing node, and a third electrode connected with the first sensing node, and an output transistor including a first electrode connected with the second sensing node, a second electrode connected with the readout line, and a third electrode that receives an output control signal.

BRIEF DESCRIPTION OF THE DRAWINGS

The above and other objects and features of the present disclosure will become apparent by describing in detail embodiments thereof with reference to the accompanying drawings.

FIG. 5D is a circuit diagram illustrating readout timing of sensors illustrated in FIG. 5B according to an embodiment of the present disclosure.

FIG. 6B is a waveform diagram for describing operations of the pixel and the sensor illustrated in FIG. 6A according to an embodiment of the present disclosure.

DETAILED DESCRIPTION OF EMBODIMENTS

Figure 1:
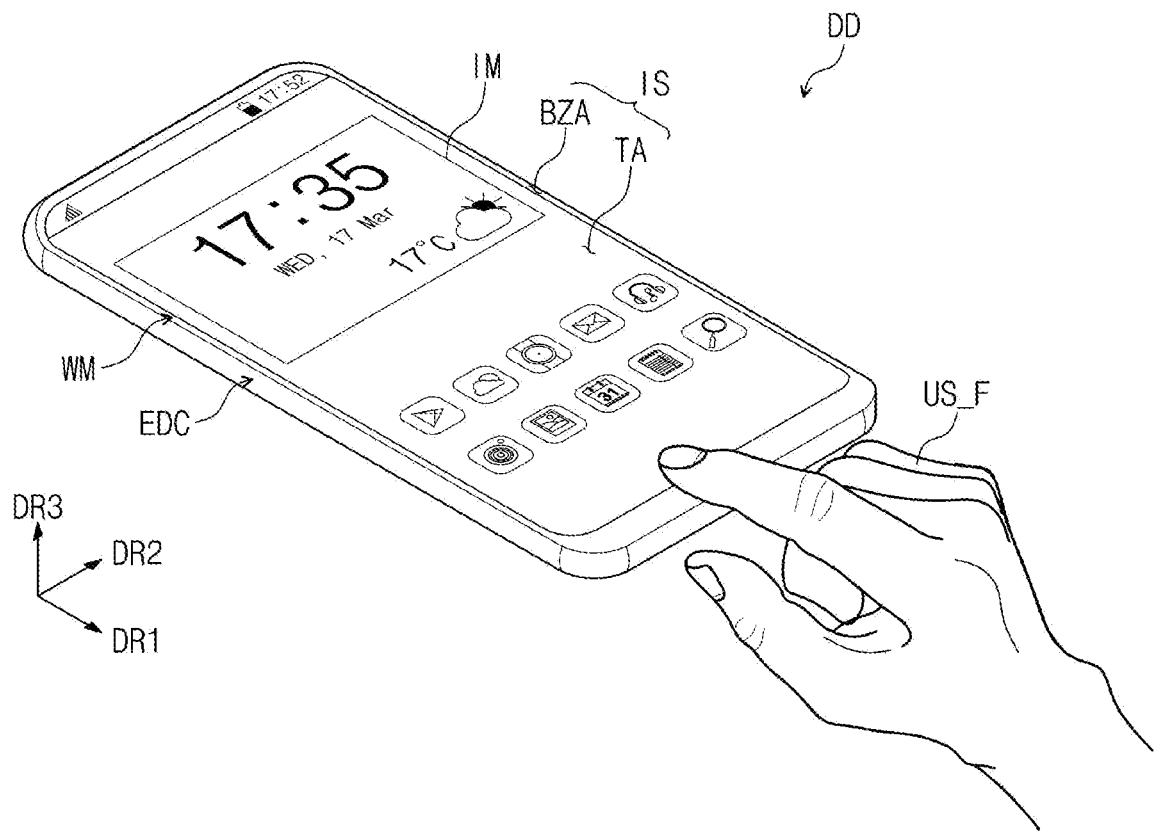
FIG. 1 is a perspective view of a display device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween. When a component (or, an area, a layer, a part, etc.) is referred to as being "directly on", "directly connected to" or "directly coupled to" another component, this means that no intervening components are present therebetween.

Identical reference numerals refer to identical components. Additionally, in the drawings, the thicknesses, proportions, and dimensions of components may be exaggerated for effective description. As used herein, the term "and/or" includes all of one or more combinations defined by related components.

Terms such as first, second, and the like may be used to describe various components, but the components should not necessarily be limited by the terms. The terms may be used only for distinguishing one component from other components. For example, without departing the scope of embodiments of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

Figure 2:
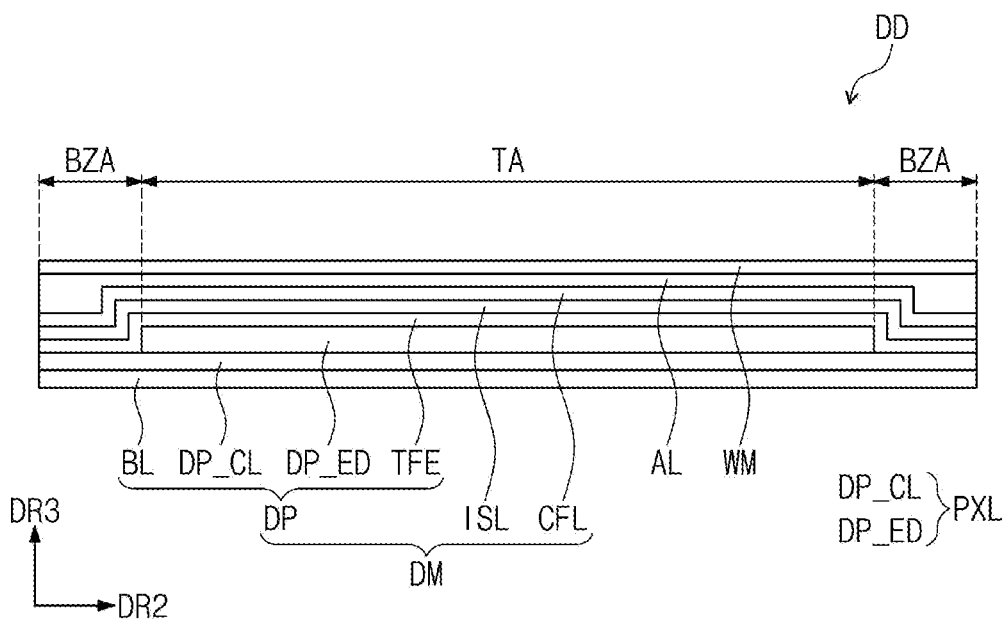
FIG. 2 is a cross-sectional view of the display device according to an embodiment of the present disclosure.

FIG. 1 is a perspective view of a display device according to an embodiment of the present disclosure. FIG. 2 is a cross-sectional view of the display device according to an embodiment of the present disclosure.

Referring to FIGS. 1 and 2, the display device DD according to an embodiment of the present disclosure may have a rectangular shape with relatively long sides parallel to a first direction DR1 and relatively short sides parallel to a second direction DR2 crossing the first direction DR1. However, embodiments of the present disclosure are not necessarily limited thereto and the display device DD may have various shapes such as a circular shape, a polygonal shape, and the like.

The display device DD may be a device activated in response to an electrical signal. The display device DD may be applied to various different electronic devices. For example, the display device DD may be applied to electronic devices such as a smart watch, a tablet computer, a notebook computer, a computer, a smart television, and the like.

Hereinafter, a normal direction substantially perpendicular to a plane defined by the first direction DR1 and the second direction DR2 is defined as a third direction DR3. As used herein, the expression "when viewed on the plane" may mean that it is viewed in the third direction DR3.

An upper surface of the display device DD may be defined as a display surface IS, and the display surface IS may be parallel to the plane defined by the first direction DR1 and the second direction DR2. Images IM generated by the display device DD may be provided to a user through the display surface IS. In the embodiment of FIG. 1, the images IM are software application icons and a clock, temperature and calendar window. However embodiments of the present disclosure are not necessarily limited thereto and the images IM may be various different subject matter.

The display surface IS may be divided into a transmissive area TA and a bezel area BZA. The transmissive area TA may be an area where the images 1M are displayed. The user visually recognizes the images IM through the transmissive area TA. In this embodiment, the transmissive area TA is illustrated in a rounded rectangular shape. However, this is illustrative, and embodiments of the present disclosure are not necessarily limited thereto. For example, the transmissive area TA may have various different shapes.

The bezel area BZA is adjacent to the transmissive area TA (e.g., in the first and/or second directions DR1, DR2). In an embodiment, the bezel area BZA may have a predetermined color. The bezel area BZA may surround the transmissive area TA. Accordingly, the shape of the transmissive area TA may be substantially defined by the bezel area BZA. However, embodiments of the present disclosure are not necessarily limited thereto, and the bezel area BZA may be disposed adjacent to only one side of the transmissive area TA, or may be omitted.

The display device DD may sense an external input applied from the outside. The external input may include various forms of inputs provided from outside the display device DD. For example, the external input may include not only direct contact by a body part of the user such as a finger US_F or direct contact by a separate device (e.g., an active pen or a digitizer) but also an external input (e.g., hovering) applied close to the display device DD or adjacent to the display device DD at a predetermined distance. Furthermore, the external input may have various forms such as force, pressure, temperature, light, and the like.

The display device DD may sense the user's biometric information applied from the outside. A biometric information sensing area capable of sensing the user's biometric information may be provided on the display surface IS of the display device DD. In an embodiment, the biometric information sensing area may be provided in the entire region of the transmissive area TA, or may be provided in a partial region of the transmissive area TA. FIG. 1 illustrates one example that the entire transmissive area TA is used as the biometric information sensing area.

The display device DD may include a window WM, a display module DM, and a housing EDC. In an embodiment, the window WM and the housing EDC may be coupled to form the exterior of the display device DD.

The front surface of the window WM defines the display surface IS of the display device DD. In an embodiment, the window WM may contain an optically clear insulating material. For example, the window WM may contain glass or plastic. The window WM may have a multi-layer structure or a single-layer structure. For example, the window WM may include a plurality of plastic films coupled through an adhesive, or may include a glass substrate and a plastic film coupled through an adhesive.

The display module DM may include a display panel DP and an input sensor ISL. The display panel DP may display an image in response to an electrical signal, and the input sensor ISL may sense an external input applied from the outside. The external input may be provided in various forms.

The display panel DP according to an embodiment of the present disclosure may be an emissive display panel. However, embodiments of the present disclosure are not necessarily limited thereto. For example, the display panel DP may be an organic light emitting display panel or an inorganic light emitting display panel. An emissive layer of the organic light emitting display panel may contain an organic light emitting material, and an emissive layer of the inorganic light emitting display panel may contain an inorganic light emitting material (e.g., quantum dots or quantum rods). Hereinafter, the display panel DP will be described as an organic light emitting display panel for convenience of explanation.

Referring to FIG. 2, the display panel DP includes a base layer BL, a pixel layer PXL, and a thin film encapsulation layer TFE. The display panel DP according to an embodiment of the present disclosure may be a flexible display panel. However, embodiments of the present disclosure are not necessarily limited thereto. For example, in some embodiments the display panel DP may be a foldable display panel that is folded about a folding axis, or a rigid display panel.

In an embodiment, the base layer BL may include a synthetic resin layer. For example, the synthetic resin layer may be a polyimide-based resin layer. However, embodiments of the present disclosure are not necessarily limited thereto and the material of the base layer BL may vary. In addition, in some embodiments the base layer BL may include a glass substrate, a metal substrate, or an organic/inorganic composite substrate.

The pixel layer PXL is disposed on the base layer BL. The pixel layer PXL may include a circuit layer DP_CL and an element layer DP_ED. The circuit layer DP_CL is disposed between the base layer BL and the element layer DP_ED (e.g., in the third direction DR3). The circuit layer DP_CL includes at least one insulating layer and at least one circuit element. Hereinafter, the insulating layer included in the circuit layer DP_CL is referred to as the intermediate insulating layer.

In an embodiment, the intermediate insulating layer includes at least one intermediate inorganic film and at least one intermediate organic film. The circuit element may include a pixel drive circuit included in each of a plurality of pixels for displaying an image and a sensor drive circuit included in each of a plurality of sensors for recognizing external information.

The external information may be biometric information. In an embodiment of the present disclosure, the sensor may be a fingerprint recognition sensor, a proximity sensor, an iris recognition sensor, or the like. Furthermore, the sensor may be an optical sensor for recognizing biometric information in an optical manner. The circuit layer DP_CL may further include signal lines connected to the pixel drive circuit and/or the sensor drive circuit.

The element layer DP_ED may include a light emitting element included in each of the pixels and a light sensing element included in each of the sensors. In an embodiment of the present disclosure, the light sensing element may be a photo diode. The light sensing element may be a sensor that senses light reflected by a fingerprint of the user or reacts to light. The circuit layer DP_CL and the element layer DP_ED will be described below in detail.

The thin film encapsulation layer TFE encapsulates the element layer DP_ED. In an embodiment, the thin film encapsulation layer TFE may include at least one organic film and at least one inorganic film. The inorganic film may contain an inorganic material and may protect the element layer DP_ED from moisture/oxygen. In an embodiment, the inorganic film may include, but is not necessarily limited to, a silicon nitride layer, a silicon oxy-nitride layer, a silicon oxide layer, a titanium oxide layer, or an aluminum oxide layer. The organic film may contain an organic material and may protect the element layer DP_ED from foreign matter such as dust particles.

The input sensor ISL may be formed on the display panel DP. In an embodiment, the input sensor ISL may be disposed directly on the thin film encapsulation layer TFE. According to an embodiment of the present disclosure, the input sensor ISL may be formed on the display panel DP by a continuous process. For example, an adhesive layer is not disposed between the input sensor ISL and the display panel DP. However, embodiments of the present disclosure are not necessarily limited thereto.

The input sensor ISL may sense an external input (e.g., a touch of the user), may change the external input to a predetermined input signal, and may provide the input signal to the display panel DP. The input sensor ISL may include a plurality of sensing electrodes for sensing the external input. The sensing electrodes may sense the external input using a mutual capacitance method, or may sense the external input using a self-capacitance method. The display panel DP may receive the input signal from the input sensor ISL and may generate an image corresponding to the input signal.

The display module DM may further include an anti-reflection layer CFL. The anti-reflection layer CFL decreases reflection of external light by absorbing all of natural light incident from outside the display device DD or by absorbing light in a specific wavelength range of the natural light. In an embodiment of the present disclosure, the anti-reflection layer CFL may be disposed on the input sensor ISL (e.g., directly thereon). However, embodiments of the present disclosure are not necessarily limited thereto.

The display device DD according to an embodiment of the present disclosure may further include an adhesive layer AL. The window WM may be attached to the input sensor ISL by the adhesive layer AL. In an embodiment, the adhesive layer AL may include an optically clear adhesive, an optically clear adhesive resin, or a pressure sensitive adhesive (PSA).

The housing EDC is coupled with the window WM. The housing EDC is coupled with the window WM to provide a predetermined inner space. The display module DM may be accommodated in the inner space. The housing EDC may contain a material having a relatively high stiffness. For example, in an embodiment the housing EDC may contain glass, plastic, or metal, or may include a plurality of frames and/or plates formed of a combination of the mentioned materials. The housing EDC may stably protect components of the display device DD accommodated in the inner space from an external impact. In an embodiment, a battery module for supplying power required for overall operation of the display device DD may be disposed between the display module DM and the housing EDC.

Figure 3:
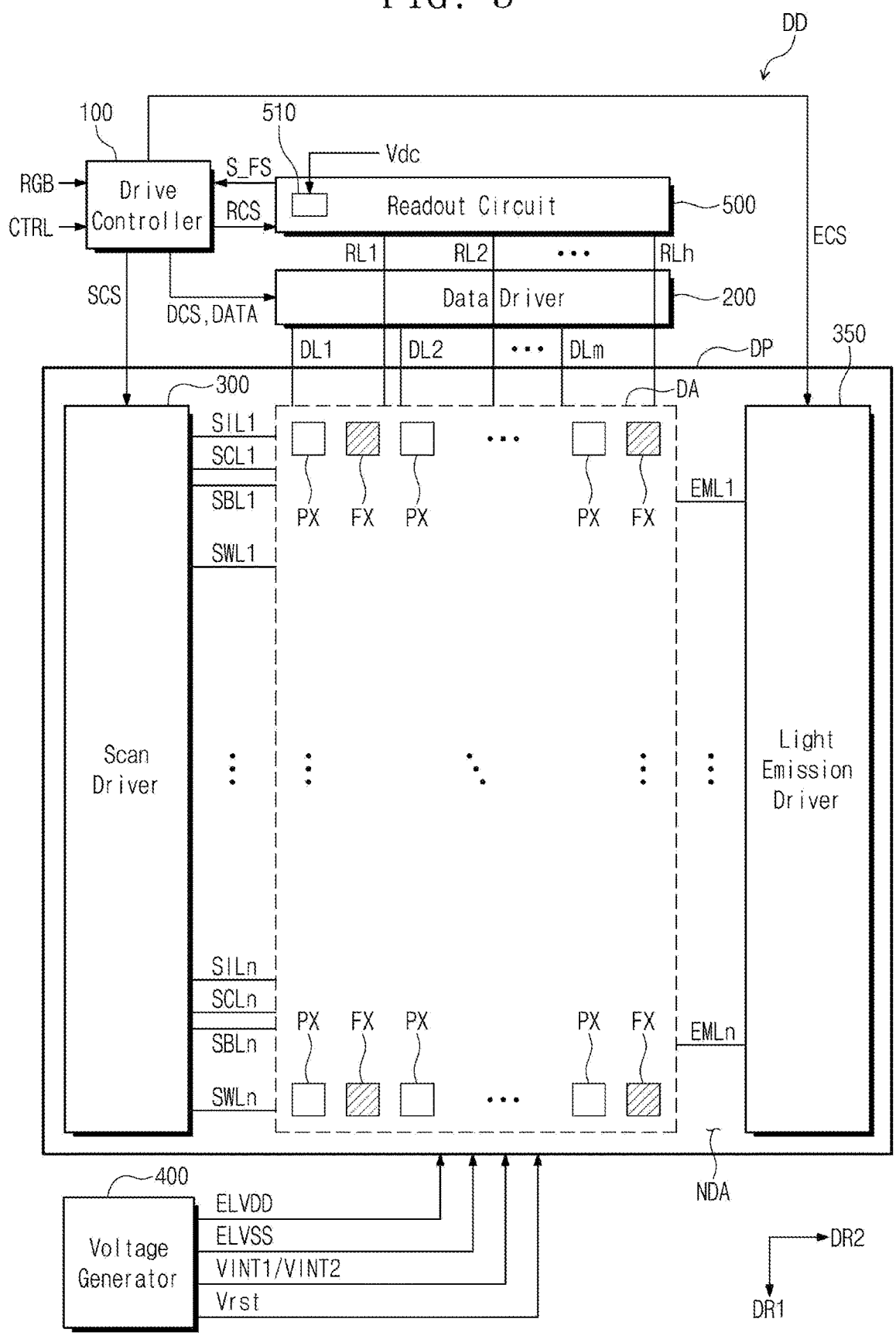
FIG. 3 is a block diagram of the display device according to an embodiment of the present disclosure.

FIG. 3 is a block diagram of the display device DD according to an embodiment of the present disclosure.

Referring to FIG. 3, the display device DD includes the display panel DP, a drive controller 100, and a drive circuit. In an embodiment of the present disclosure, the drive circuit includes a data driver 200, a scan driver 300, a light emission driver 350, a voltage generator 400, and a readout circuit 500. In an embodiment of the present disclosure, the voltage generator 400 and the readout circuit 500, together with the drive controller 100, may be implemented as one driver IC.

The drive controller 100 receives an image signal RGB and a control signal CTRL. The drive controller 100 generates an image data signal DATA by converting the data format of the image signal RGB according to the specification of an interface with the data driver 200. The drive controller 100 outputs a first control signal SCS, a second control signal ECS, a third control signal DCS, and a fourth control signal RCS.

The data driver 200 receives the third control signal DCS and the image data signal DATA from the drive controller 100. The data driver 200 converts the image data signal DATA into data signals and outputs the data signals to a plurality of data lines DL1 to DLm to be described below in which m is a natural number greater than 2. The data signals are analog voltages corresponding to the gay level value of the image data signal DATA.

The scan driver 300 receives the first control signal SCS from the drive controller 100. The scan driver 300 may output scan signals to scan lines in response to the first control signal SCS.

The voltage generator 400 generates voltages required for operation of the display panel DP. In an embodiment, the voltage generator 400 generates a first drive voltage ELVDD, a second drive voltage ELVSS, a first initialization voltage VINT1, a second initialization voltage VINT2 and a reset voltage Vrst.

The display panel DP may include a display area DA corresponding to the transmissive area TA (illustrated in FIG. 1) and a non-display area NDA corresponding to the bezel area BZA (illustrated in FIG. 1).

The display panel DP may include a plurality of pixels PX disposed in the display area DA and a plurality of sensors FX disposed in the display area DA. In an embodiment of the present disclosure, each of the plurality of sensors FX may be disposed between two pixels PX adjacent to each other. For example, the plurality of pixels PX and the plurality of sensors FX may be alternately disposed in the first and second directions DR1 and DR2. However, embodiments of the present disclosure are not necessarily limited thereto. For example, two or more pixels PX may be disposed between two sensors FX adjacent to each other in the first direction DR1 among the plurality of sensors FX, or two or more pixels PX may be disposed between two sensors FX adjacent to each other in the second direction DR2 among the plurality of sensors FX.

The display panel DP includes initialization scan lines SIL1 to SILn, compensation scan lines SCL1 to SCLn, write scan lines SWL1 to SWLn, black scan lines SBL1 to SBLn, light emission control lines EML1 to EMLn, the data lines DL1 to DLm, and readout lines RL1 to RLh in which n is a natural number greater than or equal to 2 and h is a natural number greater than or equal to 3.

The initialization scan lines SIL1 to SILn, the compensation scan lines SCL1 to SCLn, the write scan lines SWL1 to SWLn, the black scan lines SBL1 to SBLn, and the light emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the light emission control lines EML1 to EMLn are arranged in the first direction DR1 so as to be spaced apart from each other. In an embodiment of the present disclosure, the data lines DL1 to DLm and the readout lines RL1 to RLh extend in the first direction DR1 and are arranged in the second direction DR2 so as to be spaced apart from each other. However, embodiments of the present disclosure are not necessarily limited thereto.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the light emission control lines EML1 to EMLn, and the data lines DL1 to DLm, respectively. For example, each of the plurality of pixels PX may be electrically connected to four scan lines. However, embodiments of the present disclosure are not necessarily limited thereto and the number of scan lines connected to each pixel PX may vary.

The plurality of sensors FX are electrically connected to the write scan lines SWL1 to SWLn and the readout lines RL1 to RLh, respectively. In an embodiment, each of the plurality of sensors FX may be electrically connected to one scan line. However, embodiments of the present disclosure are not necessarily limited thereto and the number of scan lines connected to each sensor FX may be varied. In an embodiment of the present disclosure, the number of readout lines RL1 to RLh may be similar to the number of data lines DL1 to DLm, or the number of readout lines RL1 to RLh may correspond to ½ of the number of data lines DL1 to DLm. However, embodiments of the present disclosure are not necessarily limited thereto. For example, the number of readout lines RL1 to RLh may correspond to ¼ or ⅛ of the number of data lines DL1 to DLm.

The scan driver 300 may be disposed in the non-display area NDA of the display panel DP. The scan driver 300 receives the first control signal SCS from the drive controller 100. In response to the first control signal SCS, the scan driver 300 outputs initialization scan signals to the initialization scan lines SIL1 to SILn and outputs compensation scan signals to the compensation scan lines SCL1 to SCLn. Furthermore, in response to the first control signal SCS, the scan driver 300 may output write scan signals to the write scan lines SWL1 to SWLn and may output black scan signals to the black scan lines SBL1 to SBLn. Alternatively, in an embodiment the scan driver 300 may include first and second scan drivers. The first scan driver may output the initialization scan signals and the compensation scan signals, and the second scan driver may output the write scan signals and the black scan signals.

The light emission driver 350 may be disposed in the non-display area NDA of the display panel DP. The light emission driver 350 receives the second control signal ECS from the drive controller 100. The light emission driver 350 may output light emission control signals to the light emission control lines EML1 to EMLn in response to the second control signal ECS. Alternatively, in an embodiment the scan driver 300 may be connected to the light emission control lines EML1 to EMLn. In this embodiment, the light emission driver 350 may be omitted, and the scan driver 300 may output the light emission control signals to the light emission control lines EML1 to EMLn.

The readout circuit 500 receives the fourth control signal RCS from the drive controller 100. In response to the fourth control signal RCS, the readout circuit 500 may receive sensing signals from the readout lines RL1 to RLh. The readout circuit 500 may process the sensing signals received from the readout lines RL1 to RLh and may provide the processed sensing signals S_FS to the drive controller 100. The drive controller 100 may recognize biometric information based on the sensing signals S_FS.

The readout circuit 500 according to an embodiment of the present disclosure may further include a switching circuit 510. In response to the fourth control signal RCS, the switching circuit 510 may provide a reference voltage Vdc to the readout lines RL1 to RLh in a non-sensing section. The reference voltage Vdc may be the first drive voltage ELVDD or the second drive voltage ELVSS. However, the reference voltage Vdc is not necessarily limited to any one voltage as long as the reference voltage Vdc is a DC voltage applied to a pixel drive circuit R_PD or a sensor drive circuit O_SD. For example, according to an embodiment of the present disclosure, in a sensing section, the readout lines RL1 to RLh may provide the sensing signals to the readout circuit 500, and in the non-sensing section, the readout lines RL1 to RLh may receive the reference voltage Vdc.

Figure 4:
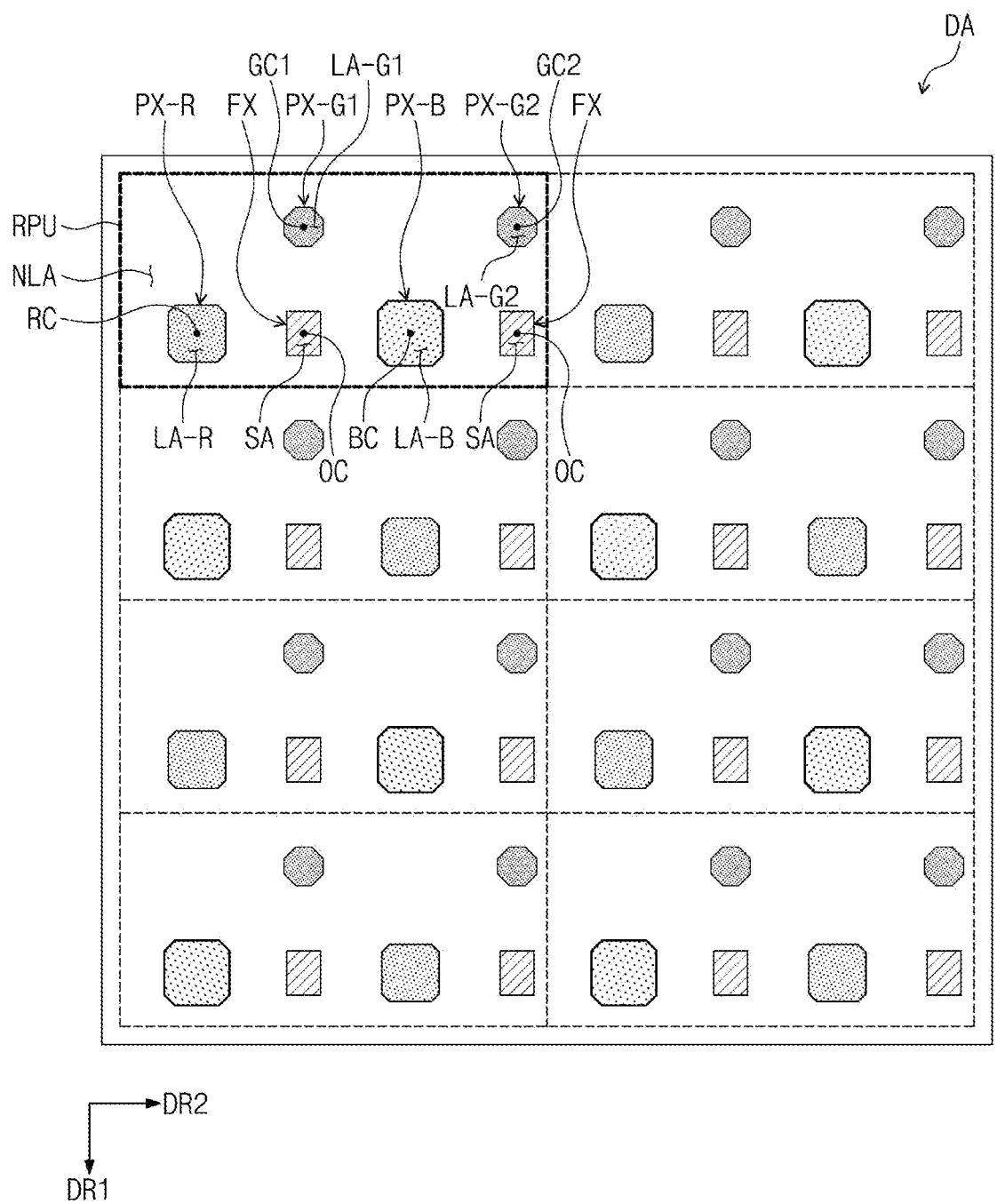
FIG. 4 is an enlarged plan view of a partial region of a display panel according to an embodiment of the present disclosure.

FIG. 4 is an enlarged plan view of a partial region of the display area DA according to an embodiment of the present disclosure.

FIG. 4 illustrates unit areas RPU repeatedly arranged in the display area DA. A unit pixel and at least one sensor FX are disposed in each of the unit areas RPU. The unit pixel may be defined as a group of repeating pixels among the plurality of pixels PX illustrated in FIG. 3.

In an embodiment, the unit pixel may include a first color pixel PX-R, two second color pixels PX-G1 and PX-G2, and a third color pixel PX-B. In this embodiment, the first color may be red, the second color may be green, and the third color may be blue. In this embodiment, the first color pixel PX-R may include a first color light emitting element and may generate red source light (hereinafter, referred to as the red light). Each of the second color pixels PX-G1 and PX-G2 may include a second color light emitting element and may generate green source light (hereinafter, referred to as the green light). The third color pixel PX-B may include a third color light emitting element and may generate blue source light (hereinafter, referred to as the blue light). However, embodiments of the present disclosure are not necessarily limited thereto and the numbers of the pixels in each unit pixel and the colors of the pixels in the unit pixel may vary.

In an embodiment, two sensors FX may be disposed in each of the unit areas RPU. One sensor FX may be disposed between the first color pixel PX-R and the third color pixel PX-B in the second direction DR2, and the other sensor FX may be disposed between the first color pixel PX-R disposed in another unit area RPU and the third color pixel PX-B in the second direction DR2. For example, the sensors FX may be disposed between the first color pixel PX-R and the third color pixel PX-B.

In FIG. 4, a first light emitting area LA-R of the first color light emitting element, second light emitting areas LA-G1 and LA-G2 of the second color light emitting elements, and a third light emitting area LA-B of the third color light emitting element are illustrated. In an embodiment, among the first light emitting area LA-R, the second light emitting areas LA-G1 and LA-G2, and the third light emitting area LA-B, the third light emitting area LA-B may have the largest area, and the second light emitting areas LA-G1 and LA-G2 may have the smallest area. Furthermore, sensing areas SA of light sensing elements of the two sensors FX are illustrated. The one first color light emitting element, the two second color light emitting elements, and the one third color light emitting element may define a unit light emitting element, and the one first light emitting area LA-R, the two second light emitting areas LA-G1 and LA-G2, and the one third light emitting area LA-B may define a unit light emitting area.

In an embodiment, the unit areas RPU arranged in the second direction DR2 may have the same pixel arrangement, and the unit areas RPU arranged in the first direction DR1 may differ from each other in terms of the positions of the first color pixel PX-R and the third color pixel PX-B. For example, among the unit areas RPU, first type unit areas and second type unit areas may be alternately disposed in the first direction DR1.

Referring to each of the unit areas RPU, the second light emitting areas LA-G1 and LA-G2 are aligned in the second direction DR2. The center points GC1 and GC2 of the second light emitting areas LA-G1 and LA-G2 are aligned in the second direction DR2. Each of the sensing areas SA is aligned with a corresponding one of the second light emitting areas LA-G1 and LA-G2 in the first direction DR1. The center points OC of the sensing areas SA are aligned with the center points GC1 and GC2 of the second light emitting areas LA-G1 and LA-G2 in the first direction DR1.

In an embodiment, the first light emitting area LA-R, the third light emitting area LA-B, and the sensing areas SA are aligned in the second direction DR2. The center point RC of the first light emitting area LA-R, the center point BC of the third light emitting area LA-B, and the center points OC of the sensing areas SA are aligned in the second direction DR2. One sensing area SA is disposed between the first light emitting area LA-R and the third light emitting area LA-B, and one of the first light emitting area LA-R and the third light emitting area LA-B is disposed between the two sensing areas SA.

Referring to FIG. 4, irrespective of the division of the unit areas RPU, each of the sensing areas SA is disposed at the center of the area defined by the first light emitting area LA-R, the third light emitting area LA-B, and the two second light emitting areas LA-G1 and LA-G2. Each of the sensing areas SA is disposed between the first light emitting area LA-R and the third light emitting area LA-B in the second direction DR2 and is disposed between the two second light emitting areas LA-G1 and LA-G2 in the first direction DR1.

Figure 5A:
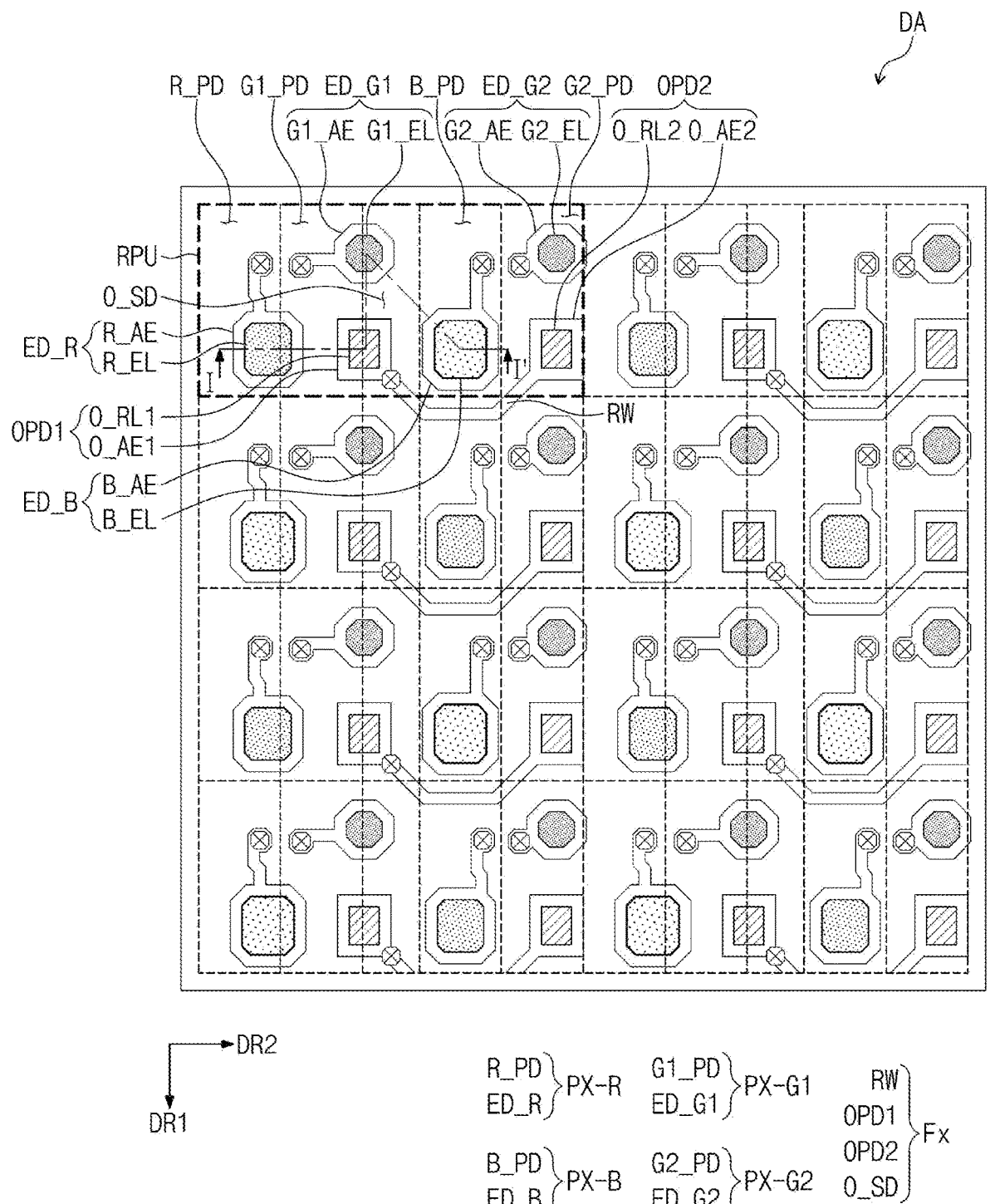
FIG. 5A is a plan view illustrating a connection relationship between a light sensing element and a sensor drive circuit according to an embodiment of the present disclosure.
Figure 5B:
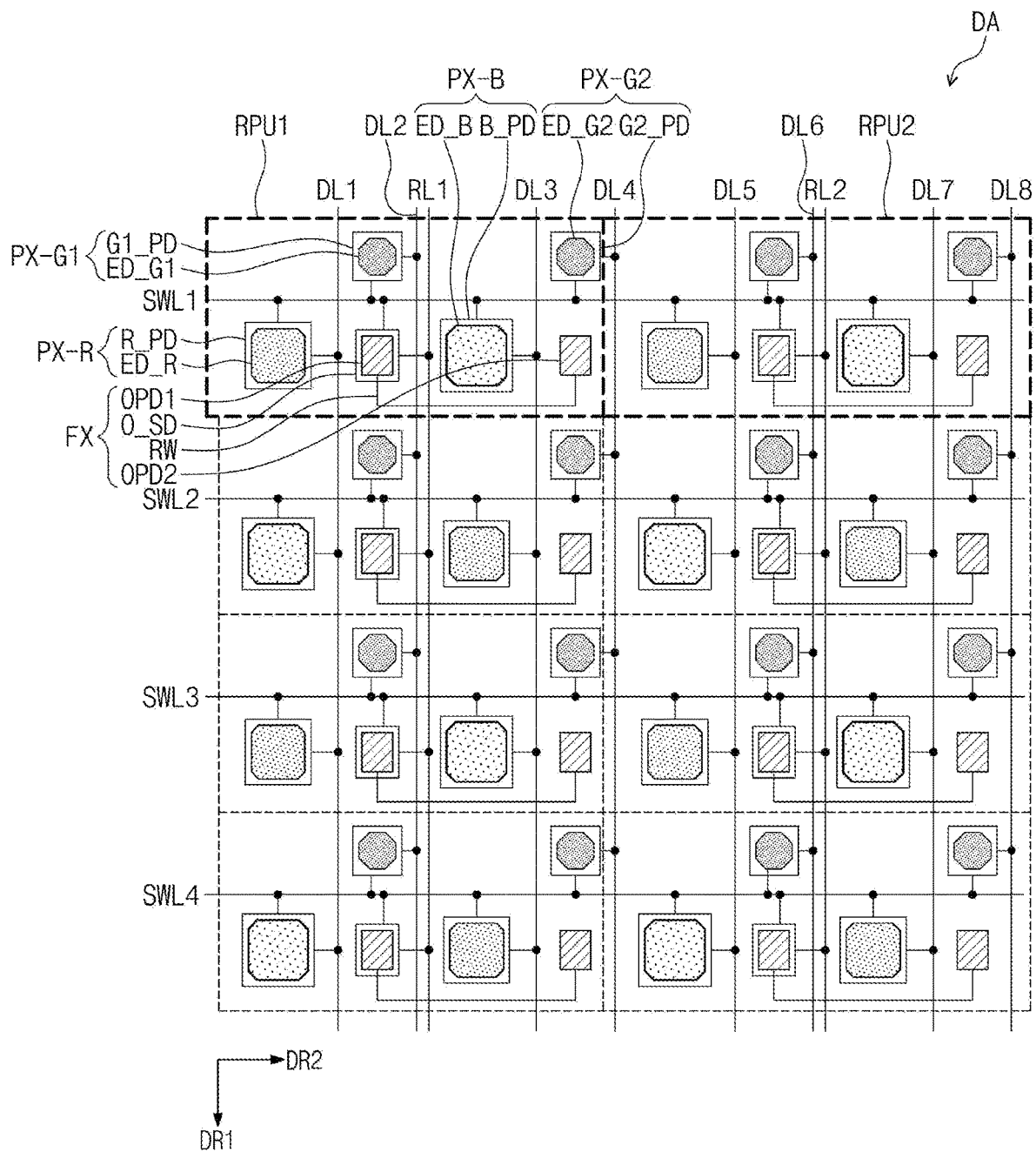
FIG. 5B is a circuit diagram illustrating the connection relationship between the light sensing element and the sensor drive circuit illustrated in FIG. 5A according to an embodiment of the present disclosure.
Figure 5C:
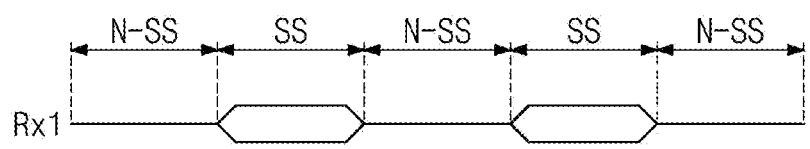
FIG. 5C is a circuit diagram illustrating readout timing depending on a sensing section and a non-sensing section of a sensor illustrated in FIG. 5B according to an embodiment of the present disclosure.

FIG. 5A is a plan view illustrating a connection relationship between a light emitting element and a pixel drive circuit and a connection relationship between a light sensing element and a sensor drive circuit according to an embodiment of the present disclosure. FIG. 5B is a circuit diagram illustrating the connection relationship between the light emitting element and the pixel drive circuit and the connection relationship between the light sensing element and the sensor drive circuit illustrated in FIG. 5A. FIG. 5C is a circuit diagram illustrating readout timing depending on a sensing section and a non-sensing section of a sensor illustrated in FIG. 5B according to an embodiment of the present disclosure. FIG. 5D is a circuit diagram illustrating readout timing of sensors illustrated in FIG. 5B according to an embodiment of the present disclosure.

Hereinafter, the first color pixel PX-R is defined as a red pixel, the second color pixels PX-G1 and PX-G2 are defined as green pixels, and the third color pixel PX-B is defined as a blue pixel. Furthermore, the first color light emitting element is defined as a red light emitting element ED_R, the second color light emitting elements are defined as green light emitting elements ED_G, and the third color light emitting element is defined as a blue light emitting element ED_B. In addition, the first light emitting area LA-R, the second light emitting area LA-G1, and the third light emitting area LA-B are defined as a red light emitting area LA-R, a green light emitting area LA-G1, and a blue light emitting area LA-B, respectively.

Referring to an embodiment shown in FIG. 5A, a first electrode R_AE and an emissive layer R_EL of the red light emitting element ED_R may correspond to the red light emitting area LA-R illustrated in FIG. 4. A first electrode G1_AE and an emissive layer G1_EL of a first green light emitting element ED_G1 may correspond to one of the second light emitting areas LA-G1 and LA-G2, and a first electrode G2_AE and an emissive layer G2_EL of a second green light emitting element ED_G2 may correspond to the other one of the second light emitting areas LA-G1 and LA-G2. A first electrode B_AE and an emissive layer B_EL of the blue light emitting element ED_B may correspond to the third light emitting area LA-B. A first electrode O_AE1 and a photoelectric conversion layer O_RL1 of a first light sensing element OPD1 may correspond to one of the two sensing areas SA in the unit area RPU, and a first electrode O_AE2 and a photoelectric conversion layer O_RL2 of a second light sensing element OPD2 may correspond to the other one of the two sensing areas SA.

A pixel drive circuit R_PD of the red pixel PX-R, a pixel drive circuit G1_PD of the first green pixel PX-G1, a pixel drive circuit G2_PD of the second green pixel PX-G2, a pixel drive circuit B_PD of the blue pixel PX-B, and a sensor drive circuit O_SD are disposed in the unit area RPU.

The first electrodes R_AE, G1_AE, G2_AE, and B_AE of the light emitting elements ED_R, ED_G1, ED_G2, and ED_B are electrically connected to the corresponding pixel drive circuits R_PD, G1_PD, G2_PD, and B_PD. For example, the red light emitting element ED_R is electrically connected to the pixel drive circuit R_PD thereof. In an embodiment, the first electrode R_AE of the red light emitting element ED_R is connected with the corresponding pixel drive circuit R_PD through a contact hole.

The sensor FX includes the first light sensing element OPD1, the second light sensing element OPD2, and the sensor drive circuit O_SD. In this embodiment, both the first light sensing element OPD1 and the second light sensing element OPD2 may be electrically connected to one sensor drive circuit OSD. The sensor FX may further include a routing wire RW electrically connecting the first and second light sensing elements OPD1 and OPD2. The first electrode O_AE1 of the first light sensing element OPD1 and the first electrode O_AE2 of the second light sensing element OPD2 may be connected through the routing wire RW, and the first electrode O_AE1 of the first light sensing element OPD1 may be connected to the sensor drive circuit O_SD through a contact hole. In an embodiment of the present disclosure, the first light sensing element OPD1 and the second light sensing element OPD2 may be connected to different sensor drive circuits O_SD. This corresponds to an embodiment in which two sensors FX are disposed in one unit area RPU.

FIG. 5B schematically illustrates a connection relationship between the pixels PX-R, PX-G1, PX-G2, and PX-B and the sensor FX for write scan lines SWL1 to SWL4, readout lines RL1 and RL2, and data lines DL1 to DL8. A first unit area RPU1 and a second unit area RPU2 arranged in the second direction DR2 will be mainly described for convenience of explanation.

Four scan lines (e.g., a write scan line, a compensation scan line, an initialization scan line, and a black scan line) are connected to each of the pixels PX-R, PX-G1, PX-G2, and PX-B. In FIG. 5B, for convenience of description, only one scan line (e.g., the write scan line) among the four scan lines is illustrated.

In FIG. 5B, four write scan lines SWL1 to SWL4 among the plurality of write scan lines SWL1 to SWLn (refer to FIG. 3), eight data lines DL1 to DL8 among the plurality of data lines DL1 to DLm (refer to FIG. 3), and two readout lines RL1 and RL2 among the plurality of readout lines RL1 to RLh (refer to FIG. 3) are illustrated.

The first write scan line SWL1 and the first to fourth data lines DL1 to DL4 may be connected to the pixels PX-R, PX-G1, PX-G2, and PX-B disposed in the first unit area RPU1. The first write scan line SWL1 and the fifth to eighth data lines DL5 to DL8 may be connected to the pixels PX-R, PX-G1, PX-G2, and PX-B disposed in the second unit area RPU2. The first write scan line SWL1 and the first readout line RL1 are connected to the sensor FX disposed in the first unit area RPU1, and the first write scan line SWL1 and the second readout line RL2 are connected to the sensor FX disposed in the second unit area RPU2.

Referring to FIGS. 5B to 5D, in a sensing section SS, the sensor drive circuit OSD may output first and second sensing signals FS1 and FS2 to the first and second readout lines RL1 and RL2 during an activation period of write scan signals SW1 to SW4 applied to the corresponding write scan lines SWL1 to SWL4. In a non-sensing section N-SS, the reference voltage Vdc may be provided to the first and second readout lines RL1 and RL2. In an embodiment, the reference voltage Vdc may be the first drive voltage ELVDD or the second drive voltage ELVSS. According to this embodiment, as the write scan lines SWL1 to SWL4 connected to the pixels PX-R, PX-G1, PX-G2, and PX-B are connected to the sensor drive circuit OSD, a write scan signal may be applied to the sensor drive circuit OSD even in the non-sensing section N-SS. At this time, noise caused by the write scan signal may be decreased by applying the reference voltage Vdc to the first and second readout lines RL1 and RL2.

Figure 6A:
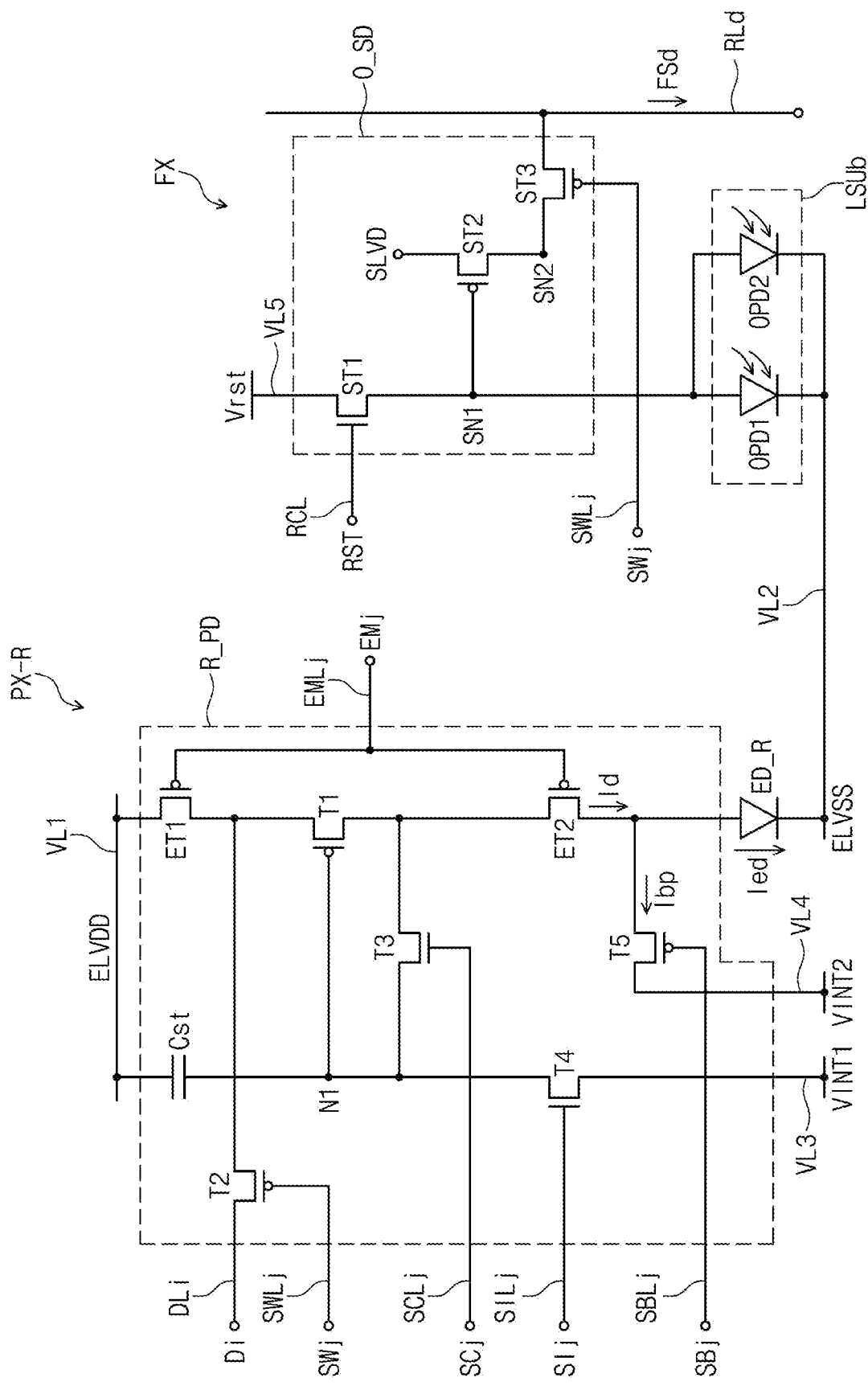
FIG. 6A is a circuit diagram illustrating a pixel and a sensor according to an embodiment of the present disclosure.

FIG. 6A is a circuit diagram illustrating the pixel PX-R and the sensor FX according to an embodiment of the present disclosure, and FIG. 6B is a waveform diagram for describing operations of the pixel PX-R and the sensor FX illustrated in FIG. 6A.

In FIG. 6, an equivalent circuit diagram of the red pixel PX-R among the plurality of pixels PX illustrated in FIG. 3 is illustrated. As the plurality of pixels PX have the same circuit structure, description of the circuit structure for the red pixel PX-R may be applied to the remaining pixels, and detailed descriptions of the remaining pixels will be omitted for economy of description. Furthermore, in FIG. 6, an equivalent circuit diagram of one sensor FX among the plurality of sensors FX illustrated in FIG. 3 is illustrated. As the plurality of sensors FX have the same circuit structure, description of the circuit structure for the sensor FX may be applied to the remaining sensors, and detailed descriptions of the remaining sensors will be omitted for economy of description.

Referring to FIG. 6A, the red pixel PX-R is connected to the i-th data line DLi, the j-th initialization scan line SILj, the j-th compensation scan line SCLj, the j-th write scan line SWLj, the j-th black scan line SBLj, and the j-th light emission control line EMLj in which i and j are both natural numbers greater than 1.

The pixel drive circuit R_PD includes first to fifth transistors T1, T2, T3, T4, and 15, first and second light emission control transistors ET1 and ET2, and one capacitor Cst. In an embodiment, at least one of the first to fifth transistors T1, T2, T3, T4, and T5 and the first and second light emission control transistors ET1 and ET2 may be a transistor having a low-temperature polycrystalline silicon (LIPS) semiconductor layer. Some of the first to fifth transistors T1, T2, T3, T4, and T5 and the first and second light emission control transistors ET1 and ET2 may be P-type transistors, and the others may be N-type transistors. For example, in an embodiment the first, second, and fifth transistors T1, T2, and T5 and the first and second light emission control transistors ET1 and ET2 may be PMOS transistors, and the third and fourth transistors T3 and T4 may be NMOS transistors. However, embodiments of the present disclosure are not necessarily limited thereto. Hereinafter, sources, drains, and gates of the first, second, and fifth transistors T1, T2, and T5 and the first and second light emission control transistors ET1 and ET2 will be described based on a PMOS transistor, and sources, drains, and gates of the third and fourth transistors T3 and T4 will be described based on an NMOS transistor.

In an embodiment, at least one of the first to fifth transistors T1, T2, T3, T4, and 15 and the first and second light emission control transistors ET1 and ET2 may be a transistor having an oxide semiconductor layer. For example, the third and fourth transistors T3 and T4 may be oxide semiconductor transistors, and the first, second, and fifth transistors T1, T2, and T5 and the first and second light emission control transistors ET and ET2 may be silicon transistors. However, embodiments of the present disclosure are not necessarily limited thereto.

The configuration of the pixel drive circuit R_PD according to embodiments of the present disclosure are not necessarily to an embodiment illustrated in FIG. 6A. The pixel drive circuit R_PD illustrated in FIG. 6A is merely an example, and various changes and modifications can be made to the configuration of the red pixel drive circuit R_PD. For example, the first to fifth transistors T1, T2, T3, T4, and T5 and the first and second light emission control transistors ET1 and ET2 may all be P-type transistors or N-type transistors.

The j-th initialization scan line SILj, the j-th compensation scan line SCLj, the j-th write scan line SWLj, the j-th black scan line SBLj, and the j-th light emission control line EMLj may transfer the j-th initialization scan signal SIj, the j-th compensation scan signal SCj, the j-th write scan signal SWj, the j-th black scan signal SBj, and the j-th light emission control signal EMj to the red pixel PX-R, respectively. The i-th data line DLi transfers the i-th data signal Di to the red pixel PX-R. The i-th data signal Di may have a voltage level corresponding to the image signal RGB (refer to FIG. 3) that is input to the display device DD (refer to FIG. 3).

A first drive voltage line VL1 and a second drive voltage line VL2 may transfer the first drive voltage ELVDD and the second drive voltage ELVSS to the red pixel PX-R, respectively. Furthermore, a first initialization voltage line VL3 and a second initialization voltage line VL4 may transfer the first initialization voltage VINT1 and the second initialization voltage VINT2 to the red pixel PX-R, respectively.

The first transistor T1 is connected between the first drive voltage line VL1 receiving the first drive voltage ELVDD and the red light emitting element ED_R. The first transistor T1 includes a source connected with the first drive voltage line VL1 via the first light emission control transistor ET1, a drain connected with the first electrode R_AE (refer to FIG. 5A) of the red light emitting element ED_R via the second light emission control transistor ET2, and a gate connected with one end (e.g., a first node N1) of the capacitor Cst. The first transistor T1 may receive the i-th data signal Di that the i-th data line DLi transfers depending on a switching operation of the second transistor T2 and may supply a drive current Id to the red light emitting element ED_R.

The second transistor T2 is connected between the data line DLi and the source of the first transistor T1. The second transistor T2 includes a source connected with the data line DLi, a drain connected with the source of the first transistor T1, and a gate connected with the j-th write scan line SWLj. The second transistor T2 may be turned on in response to the write scan signal SWj transferred through the j-th write scan line SWLj and may transfer, to the source of the first transistor T1, the i-th data signal Di transferred from the i-th data line DLi.

The third transistor T3 is connected between the drain of the first transistor T1 and the first node N1. The third transistor T3 includes a source connected with the gate of the first transistor T1, a drain connected with the drain of the first transistor T1, and a gate connected with the j-th compensation scan line SCLj. The third transistor T3 may be turned on in response to the j-th compensation scan signal SCj transferred through the j-th compensation scan line SCLj and may diode-connect the first transistor T1 by connecting the drain and the gate of the first transistor T1.

The fourth transistor T4 is connected between the first initialization voltage line VL3 to which the first initialization voltage VINT1 is applied and the first node N1. The fourth transistor T4 includes a source connected with the first initialization voltage line VL3 through which the first initialization voltage VINT1 is transferred, a drain connected with the first node N1, and a gate connected with the j-th initialization scan line SILj. The fourth transistor T4 is turned on in response to the j-th initialization scan signal SIj transferred through the j-th initialization scan line SILj. The turned-on fourth transistor T4 initializes the potential of the gate of the first transistor T1 (e.g., the potential of the first node N1) by transferring the first initialization voltage VINT1 to the first node N1.

The first light emission control transistor ET1 includes a source connected with the first drive voltage line VL1, a drain connected with the source of the first transistor T1, and a gate connected to the j-th light emission control line EMLj. The second light emission control transistor ET2 includes a source connected with the drain of the first transistor T1, a drain connected to the first electrode RAE (refer to FIG. 5A) of the red light emitting element ED_R, and a gate connected to the j-th light emission control line EMLj. The first and second light emission control transistors ET1 and ET2 are simultaneously turned on in response to the j-th light emission control signal EMj transferred through the j-th light emission control line EMLj. The first drive voltage ELVDD applied through the turned-on first light emission control transistor ET1 may be compensated for through the diode-connected first transistor T1 and may be transferred to the red light emitting element ED_R.

The fifth transistor T5 includes a drain connected to the second initialization voltage line VL4 through which the second initialization voltage VINT2 is transferred, a source connected with the drain of the second light emission control transistor ET2, and a gate connected with the j-th black scan line SBLj. In an embodiment, the second initialization voltage VINT2 may have a voltage level less than or equal to the voltage level of the first initialization voltage VINT1.

The one end of the capacitor Cst is connected with the gate of the first transistor T1 as described above, and an opposite end of the capacitor Cst is connected with the first drive voltage line VL1. A second electrode (e.g., a cathode) of the red light emitting element ED_R may be connected with the second drive voltage line VL2 that transfers the second drive voltage ELVSS. In an embodiment, the second drive voltage ELVSS may have a lower voltage level than the first drive voltage ELVDD. In an embodiment of the present disclosure, the second drive voltage ELVSS may have a lower voltage level than the first and second initialization voltages VINT1 and VINT2.

Referring to FIGS. 6A and 6B, the j-th light emission control signal EMj has a high level during a non-light emission period. Within the non-light emission period NEP, the j-th initialization scan signal SIj is activated. When the j-th initialization scan signal SIj having a high level is provided through the j-th initialization scan line SILj during an activation period AP1 (hereinafter, referred to as the first activation period) of the j-th initialization scan signal SIj, the fourth transistor T4 is turned on in response to the j-th initialization scan signal SIj having a high level. The first initialization voltage VINT1 is transferred to the gate of the first transistor T1 through the turned-on fourth transistor T4, and the first node N1 is initialized to the first initialization voltage VINT1. Accordingly, the first activation period AP1 may be defined as an initialization period of the red pixel PX-R.

The j-th compensation scan signal SCj may then be activated, and when the j-th compensation scan signal SCj having a high level is supplied through the j-th compensation scan line SCLj during an activation period AP2 (hereinafter, referred to as the second activation period) of the j-th compensation scan signal SCj, the third transistor T3 is turned on. The first transistor T1 is diode-connected by the turned-on third transistor T3 and is forward-biased. The first activation period AP1 may not overlap the second activation period AP2.

Within the second activation period AP2, the j-th write scan signal SWj is activated. The j-th write scan signal SWj has a low level during an activation period AP4 (hereinafter, referred to as the fourth activation period). During the fourth activation period AP4, the second transistor T2 is turned on by the j-th write scan signal SWj having a low level. Then, a compensation voltage "Di-Vth" obtained by subtracting the threshold voltage Vth of the first transistor T1 from the i-th data signal Di supplied through the i-th data line DLi is applied to the gate of the first transistor T1. For example, the potential of the gate of the first transistor T1 may be the compensation voltage "Di-Vth". The fourth activation period AP4 may overlap the second activation period AP2. The duration of the second activation period AP2 may be greater than the duration of the fourth activation period AP4.

The first drive voltage ELVDD and the compensation voltage "Di-Vth" may be applied to the opposite ends of the capacitor Cst, and charges corresponding to the difference between the voltages at the opposite ends may be stored in the capacitor Cst. Here, the period during which the j-th compensation scan signal SCj has a high level may be referred to as the compensation period of the red pixel PX-R.

In an embodiment, the j-th black scan signal SBj is activated within the second activation period AP2 of the j-th compensation scan signal SCj. The j-th black scan signal SBj has a low level during an activation period AP3 (hereinafter, referred to as the third activation period). During the third activation period AP3, the fifth transistor T5 is turned on by receiving the j-th black scan signal SBj having a low level through the j-th black scan line SBLj. A portion of the drive current Id may escape through the fifth transistor T5 as a bypass current Ibp. The third activation period AP3 may overlap the second activation period AP2. In an embodiment, the duration of the second activation period AP2 may be greater than the duration of the third activation period AP3. The third activation period AP3 may precede the fourth activation period AP4 and may not overlap the fourth activation period AP4.

When the red pixel PX-R displays a black image, the red pixel PX-R cannot normally display the black image if the red light emitting element ED_R emits light even though the minimum drive current of the first transistor T1 flows as the drive current Id. Accordingly, the fifth transistor T5 in the red pixel PX-R according to an embodiment of the present disclosure may distribute a portion of the minimum drive current of the first transistor T1 as the bypass current Ibp to a current path other than the current path toward the red light emitting element ED_R. Here, the minimum drive current of the first transistor T1 refers to the current flowing to the first transistor T1 under the condition that the gate-source voltage Vgs of the first transistor T1 is lower than the threshold voltage Vth so that the first transistor T1 is turned off. The minimum drive current (e.g., a current of 10 pA or less) flowing to the first transistor T1 under the condition that the first transistor T1 is turned off is transferred to the red light emitting element ED_R, and a black gray-scale image is displayed. When the red pixel PX-R displays a black image, an influence of the bypass current Ibp on the minimum drive current is relatively great, whereas when the red pixel PX-R displays an image such as a general image or a white image, the bypass current Ibp has little influence on the drive current Id. Accordingly, when the red pixel PX-R displays a black image, the current obtained by subtracting the bypass current Ibp escaping through the fifth transistor T5 from the drive current Id (e.g., a light emission current Ied) may be provided to the red light emitting element ED_R so that the black image may be clearly expressed. Thus, the red pixel PX-R may implement an accurate black gray-scale image using the fifth transistor T5, thereby increasing the contrast ratio.

After that, the j-th light emission control signal EMj supplied from the j-th light emission control line EMLj is changed from a high level to a low level. The first and second light emission control transistors ET1 and ET2 are turned on by the light emission control signal EMj having a low level. The drive current Id depending on the voltage difference between the voltage of the gate of the first transistor T1 and the first drive voltage ELVDD is then generated. The drive current Id is supplied to the red light emitting element ED_R through the second light emission control transistor ET2, and the current Ied flows through the red light emitting element ED_R.

Referring again to FIG. 6A, the sensor FX is connected to the d-th readout line among the readout lines RL1 to RLh, the j-th write scan line SWLj, and a reset control line RCL.

The sensor FX includes at least one light sensing element OPD1 and OPD2 and the sensor drive circuit OSD. For example, in an embodiment shown in FIG. 6A, two light sensing elements OPD1 and OPD2 are connected with each other in parallel. The first and second light sensing elements OPD1 and OPD2 may be connected to a first sensing node SN1, and second electrodes of the first and second light sensing elements OPD1 and OPD2 may be connected with the second drive voltage line VL2 that transfers the second drive voltage ELVSS.

The sensor drive circuit O_SD includes three transistors ST1, ST2, and ST3. The three transistors ST1, ST2, and ST3 may include the reset transistor ST1, the amplifying transistor ST2, and the output transistor ST3. In an embodiment, at least one of the reset transistor ST1, the amplifying transistor ST2, and the output transistor ST3 may be an oxide semiconductor transistor. For example, in an embodiment of the present disclosure, the reset transistor ST1 may be an oxide semiconductor transistor, and the amplifying transistor ST2 and the output transistor ST3 may be silicon transistors. However, embodiments of the present disclosure are not necessarily limited thereto. For example, in an embodiment at least the reset transistor ST1 and the output transistor ST3 may be oxide semiconductor transistors, and the amplifying transistor ST2 may be a silicon transistor.

Furthermore, some of the reset transistor ST1, the amplifying transistor ST2, and the output transistor ST3 may be P-type transistors, and the remaining transistors may be an N-type transistor. In an embodiment of the present disclosure, the amplifying transistor ST2 and the output transistor ST3 may be PMOS transistors, and the reset transistor ST1 may be an NMOS transistor. However, embodiments of the present disclosure are not necessarily limited thereto. For example, in an embodiment the reset transistor ST1, the amplifying transistor ST2, and the output transistor ST3 may all be N-type transistors or P-type transistors. Hereinafter, sources, drains, and gates of the amplifying transistor ST2 and the output transistor ST3 will be described based on a PMOS transistor, and a source, a drain, and a gate of the reset transistor ST1 will be described based on an NMOS transistor for convenience of explanation.

Some of the reset transistor ST1, the amplifying transistor ST2, and the output transistor ST3 (e.g., the reset transistor ST1) may be of the same type as the third and fourth transistors T3 and T4 of the red pixel PX-R. In an embodiment, the amplifying transistor ST2 and the output transistor ST3 may be transistors of the same type as the first, second, and fifth transistors T1, T2, and T5 and the first and second light emission control transistors ET1 and ET2 of the red pixel PX-R.

A circuit configuration of the sensor drive circuit O_SD according to an embodiment the present disclosure is not necessarily limited to that illustrated in FIG. 6A. The sensor drive circuit O_SD illustrated in FIG. 6A is merely an example, and various changes and modifications can be made to the configuration of the sensor drive circuit O_SD.

The reset transistor ST1 includes a source that receives a reset voltage Vrst, a drain connected with the first sensing node SN1, and a gate that receives a reset control signal RST. In response to the reset control signal RST, the reset transistor ST1 may reset the potential of the first sensing node SN1 to the reset control signal RST. The reset control signal RST may be a signal provided through the reset control line RCL. However, embodiments of the present disclosure are not necessarily limited thereto. For example, in an embodiment the reset control signal RST may be the j-th compensation scan signal SCj supplied through the j-th compensation scan line SCLj. For example, the reset transistor ST1 may receive the j-th compensation scan signal SCj, which is supplied from the j-th compensation scan line SCLj, as the reset control signal RST. In an embodiment of the present disclosure, the reset voltage Vrst may have a lower voltage level than the second drive voltage ELVSS at least during an activation period of the reset control signal RST. The reset voltage Vrst may be a DC voltage maintained at a lower voltage level than the second drive voltage ELVSS.

The amplifying transistor ST2 includes a source that receives a sensing drive voltage SLVD, a drain connected with a second sensing node SN2, and a gate connected with the first sensing node SN1. The amplifying transistor ST2 may be turned on depending on the potential of the first sensing node SN1 and may apply the sensing drive voltage SLVD to the second sensing node SN2. In an embodiment of the present disclosure, the sensing drive voltage SLVD may be one of the first drive voltage ELVDD and the first and second initialization voltages VINT1 and VINT2. In an embodiment in which the sensing drive voltage SLVD is the first drive voltage ELVDD, the source of the amplifying transistor ST2 may be electrically connected to the first drive voltage line VL1. In an embodiment in which the sensing drive voltage SLVD is the first initialization voltage VINT1, the source of the amplifying transistor ST2 may be electrically connected to the first initialization voltage line VL3, and in an embodiment in which the sensing drive voltage SLVD is the second initialization voltage VINT2, the source of the amplifying transistor ST2 may be electrically connected to the second initialization voltage line VL4.

The output transistor ST3 includes a source connected with the second sensing node SN2, a drain connected with the d-th readout line RLd, and a gate that receives an output control signal. In response to the output control signal, the output transistor ST3 may transfer a sensing signal FSi to the d-th readout line RLd. In an embodiment shown in FIG. 6A, the output control signal may be the j-th write scan signal SWj supplied through the j-th write scan line SWLj. For example, the output transistor ST3 may receive the j-th write scan signal SWj, which is supplied from the j-th write scan line SWLj, as the output control signal.

The first and second light sensing elements OPD1 and OPD2 of the sensor FX may be exposed to light during a light emission period of the light emitting elements ED_R, ED_G1, ED_G2, and ED_B (refer to FIG. 5A). The light may be light output from at least one of the light emitting elements ED_R, ED_G1, ED_G2, and ED_B.

If the user's finger US_F (refer to FIG. 1) touches the display surface IS (refer to FIG. 1), the first and second light sensing elements OPD1 and OPD2 may generate photo-charges corresponding to light reflected by ridges of a fingerprint or valleys between the ridges, and the generated photo-charges may be accumulated in the first sensing node SN1. In an embodiment, the amplifying transistor ST2 may be a source follower amplifier that generates a source-drain current in proportion to the amount of charge of the first sensing node SN1 input to the gate.

During the fourth activation period AP4 (refer to FIG. 6B), the j-th write scan signal SWj having a low level is supplied to the output transistor ST3 through the j-th write scan line SWLj. When the output transistor ST3 is turned on in response to the j-th write scan signal SWj having a low level, a sensing signal FSd corresponding to a current flowing through the amplifying transistor ST2 may be output to the d-th readout line RLd.

When the reset control signal RST having a high level is supplied through the reset control line RCL during the reset period RSP (refer to FIG. 6B), the reset transistor ST1 is turned on. The reset period RSP may be defined as an activation period (e.g., a high level period) of the reset control line RCL. Alternatively, when the reset transistor ST1 is implemented with a PMOS transistor, the reset control signal RST having a low level may be supplied to the reset control line RCL during the reset period RSP. During the reset period RSP, the first sensing node SN1 may be reset to a potential corresponding to the reset voltage Vrst. In an embodiment of the present disclosure, the reset voltage Vrst may have a lower voltage level than the second drive voltage ELVSS.

When the reset period RSP ends, the first and second light sensing elements OPD1 and OPD2 may generate photo-charges corresponding to the received light, and the generated photo-charges may be accumulated in the first sensing node SN1.

Figure 7:
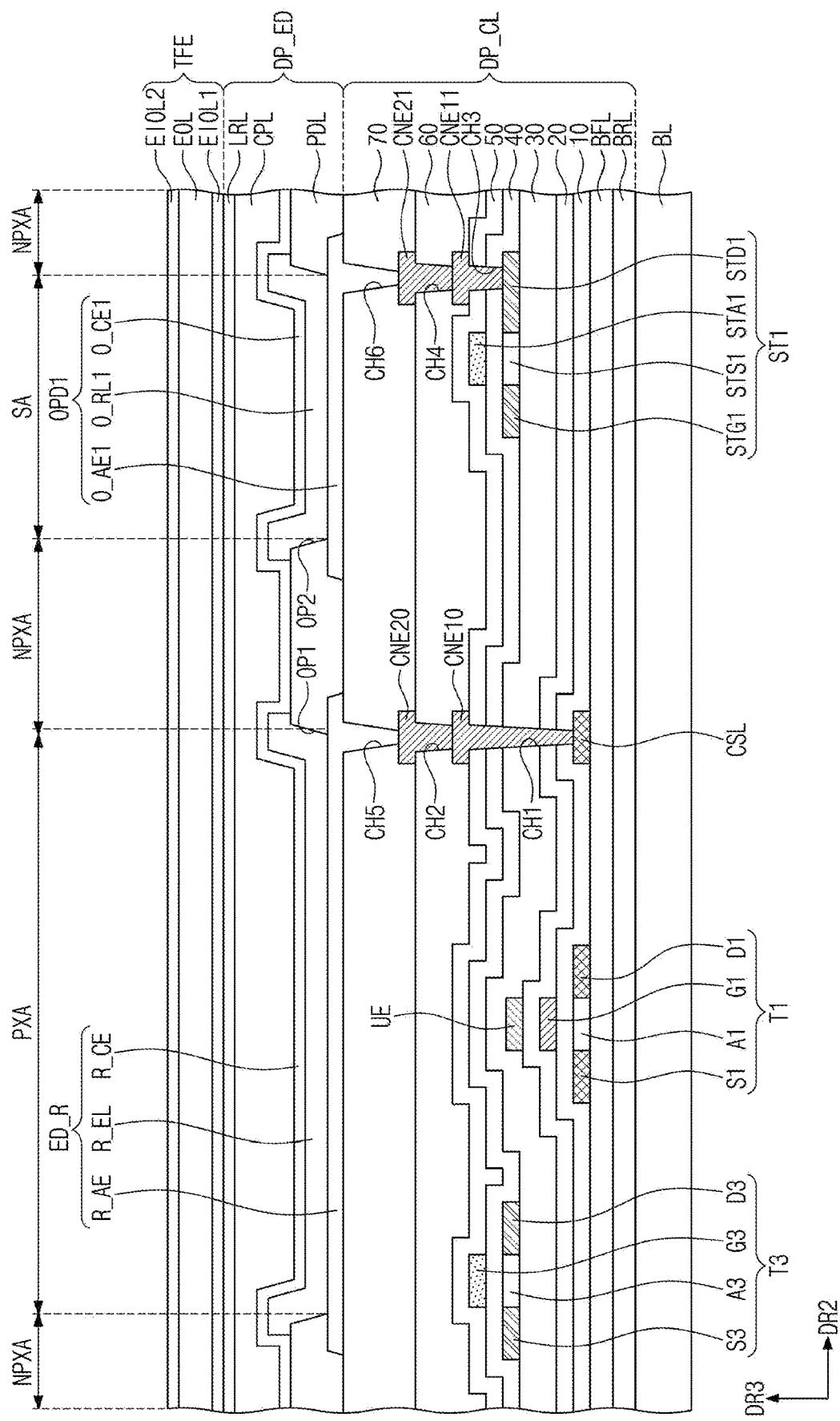
FIG. 7 is a cross-sectional view of the display panel according to an embodiment of the present disclosure.

FIG. 7 is a cross-sectional view of the display panel according to an embodiment of the present disclosure.

Referring to FIG. 7, the display panel DP may include the base layer BL, the circuit layer DP-CL, and the element layer DP_ED.

In an embodiment, the base layer BL may include a synthetic resin layer. The synthetic resin layer may contain a thermosetting resin. For example, the synthetic resin layer may be a polyimide-based resin layer. However, embodiments of the present disclosure are not necessarily limited thereto, and the material of the synthetic resin layer may vary. In an embodiment, the synthetic resin layer may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In addition, the base layer BL may include a glass substrate, a metal substrate, or an organic/inorganic composite substrate.

At least one inorganic layer is formed on the upper surface of the base layer BL. In an embodiment, the inorganic layer may contain at least one of aluminum oxide, titanium oxide, silicon oxide, silicon oxy-nitride, zirconium oxide, and hafnium oxide. The inorganic layer may be formed in multiple layers. The multiple inorganic layers may constitute a barrier layer BRL and/or a buffer layer BFL that will be described below. The barrier layer BRL and the buffer layer BF may be selectively disposed.

The circuit layer DP_CL may include the barrier layer BRL and/or the buffer layer BFL. The barrier layer BRL prevents infiltration of foreign matter from the outside. In an embodiment, the barrier layer BRL may include a silicon oxide layer and a silicon nitride layer. A plurality of silicon oxide layers and a plurality of silicon nitride layers may be provided for the barrier layer BRL. For example, the silicon oxide layers and the silicon nitride layers may be alternately stacked one above another (e.g., in the third direction DR3).

The buffer layer BFL may be disposed on the barrier layer BRL. The buffer layer BFL may increase the coupling force between the base layer BL and a semiconductor pattern and/or a conductive pattern. In an embodiment, the buffer layer BFL may include silicon oxide layers and silicon nitride layers. For example, the silicon oxide layers and the silicon nitride layers may be alternately stacked one above another (e.g., in the third direction DR3).

The semiconductor pattern is disposed on the buffer layer BFL. Hereinafter, the semiconductor pattern directly disposed on the buffer layer BFL is defined as the first semiconductor pattern. The first semiconductor pattern may include a silicon semiconductor. For example, in an embodiment the first semiconductor pattern may contain poly-silicon. However, embodiments of the present disclosure are not necessarily limited thereto. For example, in an embodiment the first semiconductor pattern may contain amorphous silicon.

FIG. 7 merely illustrates a portion of the first semiconductor pattern, and the first semiconductor pattern may be additionally disposed in another area of the red pixel PX-R (refer to FIG. 4). The first semiconductor pattern has different electrical properties depending on whether the first semiconductor pattern is doped or not. The first semiconductor pattern may include a doped area and an undoped area. The doped area may be doped with an N-type dopant or a P-type dopant. A P-type transistor may include a doped area doped with a P-type dopant, and an N-type transistor may include a doped area doped with an N-type dopant.

The doped area has a higher conductivity than the undoped area and substantially serves as an electrode or a signal line. The undoped area substantially corresponds to an active area (e.g., a channel) of a transistor. For example, a portion of the first semiconductor pattern may be an active area of a transistor, another portion may be a source or drain of the transistor, and another portion may be a connecting signal line (or, a connecting electrode).

As illustrated in FIG. 7, the first electrode S1 (e.g., the source), a channel part A1, and the second electrode D1 (e.g., the drain) of the first transistor T1 are formed from the first semiconductor pattern. The first electrode S1 and the second electrode D1 of the first transistor T1 extend from the channel part A1 in opposite directions (e.g., in the second direction DR2 and a direction opposite to the second direction DR2).

In FIG. 7, a portion of a connecting signal line CSL formed from the semiconductor pattern is illustrated. In an embodiment, the connecting signal line CSL may be connected to the second electrode (e.g., the drain) of the second light emission control transistor ET2 (refer to FIG. 6A) on the plane.

A first insulating layer 10 is disposed on the buffer layer BFL. The first insulating layer 10 commonly overlaps the plurality of pixels PX (refer to FIG. 3) and covers the first semiconductor pattern. The first insulating layer 10 may be an inorganic layer and/or an organic layer and may have a single-layer structure or a multi-layer structure. For example, in an embodiment the first insulating layer 10 may contain at least one of aluminum oxide, titanium oxide, silicon oxide, silicon oxy-nitride, zirconium oxide, and hafnium oxide. In this embodiment, the first insulating layer 10 may be a single silicon oxide layer. Not only the first insulating layer 10 but also insulating layers of the circuit layer DP_CL to be described below may be inorganic layers and/or organic layers and may have a single-layer structure or a multi-layer structure. In an embodiment, the inorganic layers may contain at least one of the aforementioned materials.

The third electrode G1 (e.g., the gate) of the first transistor T1 is disposed on the first insulating layer 10. The third electrode G1 may be a portion of a metal pattern. The third electrode G1 of the first transistor T1 overlaps the channel part A1 of the first transistor T1. The third electrode G1 of the first transistor T1 may serve as a mask in a process of doping the first semiconductor pattern.

A second insulating layer 20 that covers the third electrode G1 is disposed on the first insulating layer 10. The second insulating layer 20 commonly overlaps the plurality of pixels PX. The second insulating layer 20 may be an inorganic layer and/or an organic layer and may have a single-layer structure or a multi-layer structure. For example, in an embodiment the second insulating layer 20 may be a single silicon oxide layer.

An upper electrode UE may be disposed on the second insulating layer 20. The upper electrode UE may overlap the third electrode G1 (e.g., in the third direction DR3). The upper electrode UE may be a portion of a metal pattern, or may be a portion of a doped semiconductor pattern. A portion of the third electrode G1 and the upper electrode UE overlapping the portion of the third electrode G1 may define the capacitor Cst (refer to FIG. 6A). However, embodiments of the present disclosure are not necessarily limited thereto. For example, in an embodiment, the upper electrode UE may be omitted.

In an embodiment of the present disclosure, the second insulating layer 20 may be replaced with an insulating pattern. The upper electrode UE is disposed on the insulating pattern. The upper electrode UE may serve as a mask that forms the insulating pattern from the second insulating layer 20.

A third insulating layer 30 that covers the upper electrode UE is disposed on the second insulating layer 20. In an embodiment, the third insulating layer 30 may be a single silicon oxide layer. A semiconductor pattern is disposed on the third insulating layer 30. Hereinafter, the semiconductor pattern directly disposed on the third insulating layer 30 is defined as the second semiconductor pattern. In an embodiment, the second semiconductor pattern may include an oxide semiconductor. The oxide semiconductor may include a crystalline or amorphous oxide semiconductor. For example, the oxide semiconductor may contain metal oxide of zinc (Zn), indium (In), gallium (Ga), tin (Sn), or titanium (Ti), or may contain metal such as zinc (Zn), indium (In), gallium (Ga), tin (Sn), or titanium (Ti) and a mixture of oxide thereof. The oxide semiconductor may contain indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), or zinc-tin oxide (ZTO).

FIG. 7 merely illustrates a portion of the second semiconductor pattern, and the second semiconductor pattern may be additionally disposed in another area of the red pixel PX-R. In an embodiment, the second semiconductor pattern may include a plurality of areas distinguished depending on whether metal oxide is reduced or not. An area where metal oxide is reduced (hereinafter, referred to as the reduced area) has a higher conductivity than an area where metal oxide is not reduced (hereinafter, referred to as the non-reduced area). The reduced area substantially serves as an electrode or a signal line. The non-reduced area substantially corresponds to a channel part of a transistor. For example, one portion of the second semiconductor pattern may be a channel part of a transistor, and another portion may be a first electrode or a second electrode of the transistor.

The circuit layer DP_CL may further include a portion of a semiconductor pattern of the sensor drive circuit O_SD (refer to FIG. 6A). For convenience of description, the reset transistor ST1 of the semiconductor pattern of the sensor drive circuit O_SD is illustrated. The first electrode STS1 (e.g., the source), a channel part STA1, and the second electrode STD1 (e.g., the drain) of the reset transistor ST1 are formed from the second semiconductor pattern. In an embodiment of the present disclosure, the second semiconductor pattern may contain metal oxide. The first electrode STS1 and the second electrode STD1 include metal reduced from a metal oxide semiconductor. The first electrode STS1 and the second electrode STD1 may include a metal layer having a predetermined thickness from the upper surface of the second semiconductor pattern and containing the reduced metal.

A fourth insulating layer 40 is disposed to cover the first electrode STS1, the channel part STA1, and the second electrode STD1 of the first reset transistor ST1. The third electrode STG1 (e.g., the gate) of the first reset transistor ST1 is disposed on the fourth insulating layer 40. In this embodiment, the third electrode STG1 may be a portion of a metal pattern. The third electrode STG1 of the reset transistor ST1 overlaps the channel part STA1 of the first reset transistor T1. Although one third electrode STG1 is illustrated in an embodiment of FIG. 7 for convenience of description, the first reset transistor ST1 may include two or more third electrodes.

A fifth insulating layer 50 that covers the third electrode G3 is disposed on the fourth insulating layer 40. In an embodiment, the fifth insulating layer 50 may include a silicon oxide layer and a silicon nitride layer. For example, the fifth insulating layer 50 may include a plurality of silicon oxide layers and a plurality of silicon nitride layers alternately stacked one above another (e.g., in the third direction DR3).

At least one insulating layer is additionally disposed on the fifth insulating layer 50. For example, in an embodiment a sixth insulating layer 60 and a seventh insulating layer 70 may be disposed on the fifth insulating layer 50. The sixth insulating layer 60 and the seventh insulating layer 70 may be organic layers and may have a single-layer structure or a multi-layer structure. For example, each of the sixth insulating layer 60 and the seventh insulating layer 70 may be a single polyimide-based resin layer. In an embodiment, the sixth insulating layer 60 and the seventh insulating layer 70 may contain at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. However, embodiments of the present disclosure are not necessarily limited thereto.

A first connecting electrode CNE10 may be disposed on the fifth insulating layer 50. The first connecting electrode CNE10 may be connected to the connecting signal line CSL through a first contact hole CH1 penetrating the first to fifth insulating layers 10 to 50, and a second connecting electrode CNE20 may be connected to the first connecting electrode CNE10 through a second contact hole CH2 penetrating the sixth insulating layer 60. However, embodiments of the present disclosure are not necessarily limited thereto. For example, in an embodiment at least one of the fifth to seventh insulating layers 50 to 70 may be omitted, and one of the first and second connecting electrodes CNE10 and CNE20 may be omitted.

A third connecting electrode CNE11 may be additionally disposed on the fifth insulating layer 50. The third connecting electrode CNE11 may be connected with the third electrode STD1 of the reset transistor ST1 through a third contact hole CH3 penetrating the fourth and fifth insulating layers 40 and 50, and a fourth connecting electrode CNE21 may be connected to the third connecting electrode CNE11 through a fourth contact hole CH4 penetrating the sixth insulating layer 60.

According to an embodiment, the data line DLi (refer to FIG. 6A) and the readout line RLd (refer to FIG. 6A) may be disposed on the same layer as the second and fourth connecting electrodes CNE20 and CNE21 (e.g., on the sixth insulating layer 60). However, embodiments of the present disclosure are not necessarily limited thereto. Alternatively, the data line DLi (refer to FIG. 6A) and the readout line RLd may be disposed on the same layer as the first and third connecting electrodes CNE10 and CNE11 (e.g., on the fifth insulating layer 50). The second and fourth connecting electrodes CNE20 and CNE21, the data line DLi, and the readout line RLd are covered by the sixth insulating layer 60.

The element layer DP_ED is disposed on the circuit layer DP_CL. The element layer DP_ED may include the red anode electrode R_AE of the red light emitting element ED_R and the sensing anode electrode O_AE1 of the first light sensing element OPD1. As illustrated in FIG. 7, the red anode electrode R_AE may be connected to the second connecting electrode CNE20 through a fifth contact hole CH5 penetrating the seventh insulating layer 70. The sensing anode electrode O_AE may be connected to the fourth connecting electrode CNE21 through a sixth contact hole CNT6 penetrating the seventh insulating layer 70.

The element layer DP_ED further includes a pixel defining layer PDL disposed on the circuit layer DP_CL. The pixel defining layer PDL may include a light emitting opening OP1 defined to correspond to the red light emitting element ED_R and a light receiving opening OP2 defined to correspond to the first light sensing element OPD1. The light emitting opening OP1 exposes at least a portion of the red anode electrode RAE of the red light emitting element ED_R. The light emitting opening OP1 of the pixel defining film PDL may define an emissive area PXA. For example, the plurality of pixels PX (refer to FIG. 3) may be disposed on the plane of the display layer DPL (refer to FIG. 3) according to a predetermined rule. The area where the plurality of pixels PX are disposed may be defined as a pixel area, and one pixel area may include an emissive area PXA and a non-emissive area NPXA immediately adjacent to the emissive area PXA. The non-emissive area NPXA may surround the emissive area PXA. The emissive area PXA illustrated in FIG. 7 may correspond to the first light emitting area LA-R described with reference to FIGS. 4 to 5B.

The light receiving openings OP2 exposes the first sensing anode electrode O_AE1 of the first light sensing element OPD1. The light receiving opening OP2 of the pixel defining film PDL may define a sensing area SA. For example, the plurality of sensors FX (refer to FIG. 3) may be disposed on the plane of the display layer DP according to a predetermined rule. The area where the plurality of sensors FX are disposed may be defined as a sensing area, and one sensing area may include a sensing area SA and a non-emissive area NPXA adjacent to the sensing area SA. The non-emissive area NPXA may surround the sensing area SA.

The red emissive layer R_EL is disposed to correspond to the light emitting opening OP1 defined in the pixel defining layer PDL, and the first photo-electric conversion layer O_RL1 is provided to correspond to the light receiving opening OP2 defined in the pixel defining layer PDL. Although the patterned red emissive layer R_EL is illustrated in this embodiment, embodiments of the present disclosure are not necessarily limited thereto. For example, in an embodiment, a common emissive layer may be commonly disposed for the plurality of pixels PX. In this embodiment, the common emissive layer may generate white light or blue light. However, embodiments of the present disclosure are not necessarily limited thereto. A common cathode electrode R_CE and O_CE1 is commonly connected to the light emitting element ED_R and the light sensing element OPD1. Accordingly, the common cathode electrode R_CE and O_CE1 is integrally provided and is commonly disposed for the plurality of pixels PX and the plurality of sensors FX.

Figure 8:
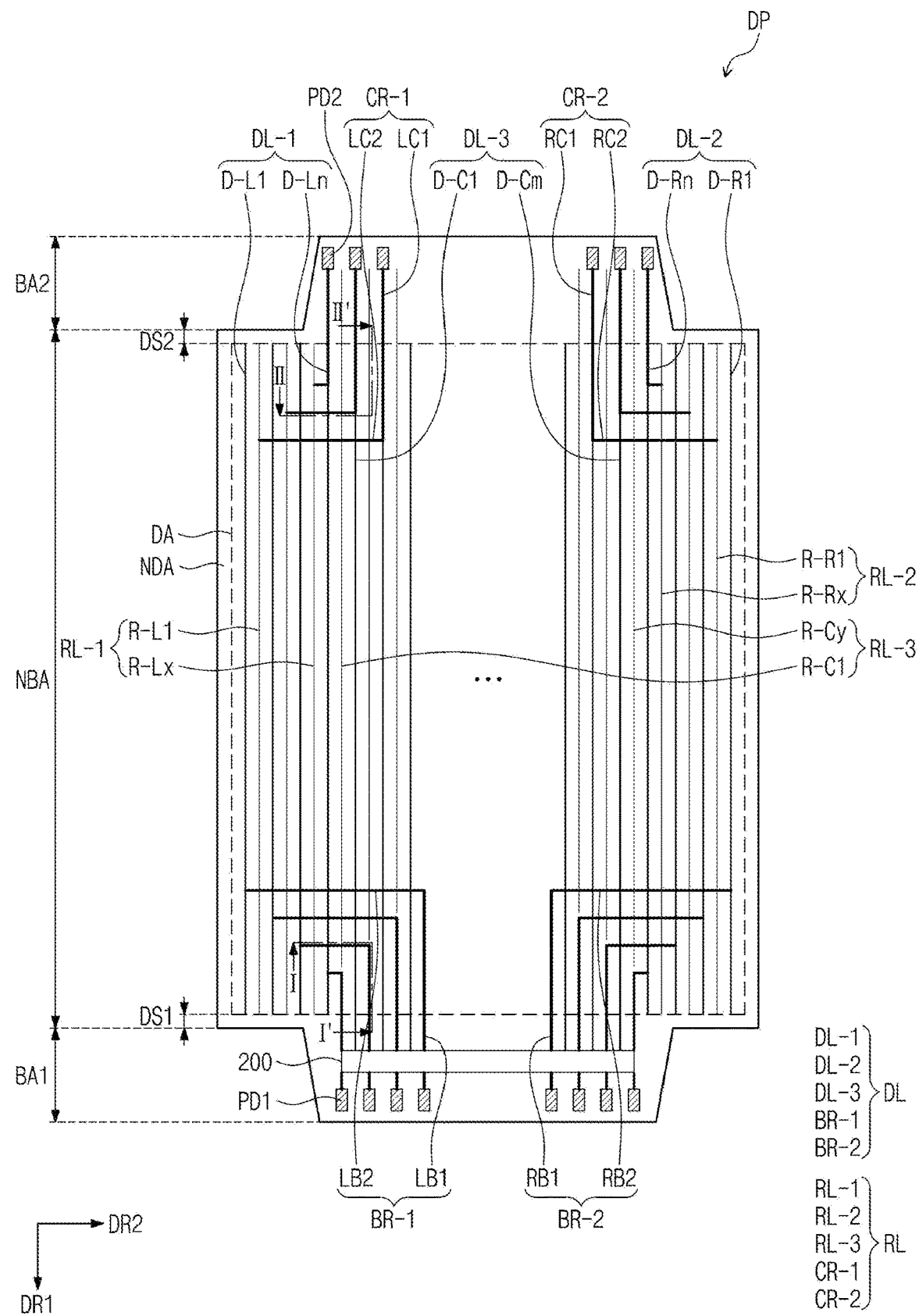
FIG. 8 is a plan view of the display panel according to an embodiment of the present disclosure.
Figure 9A:
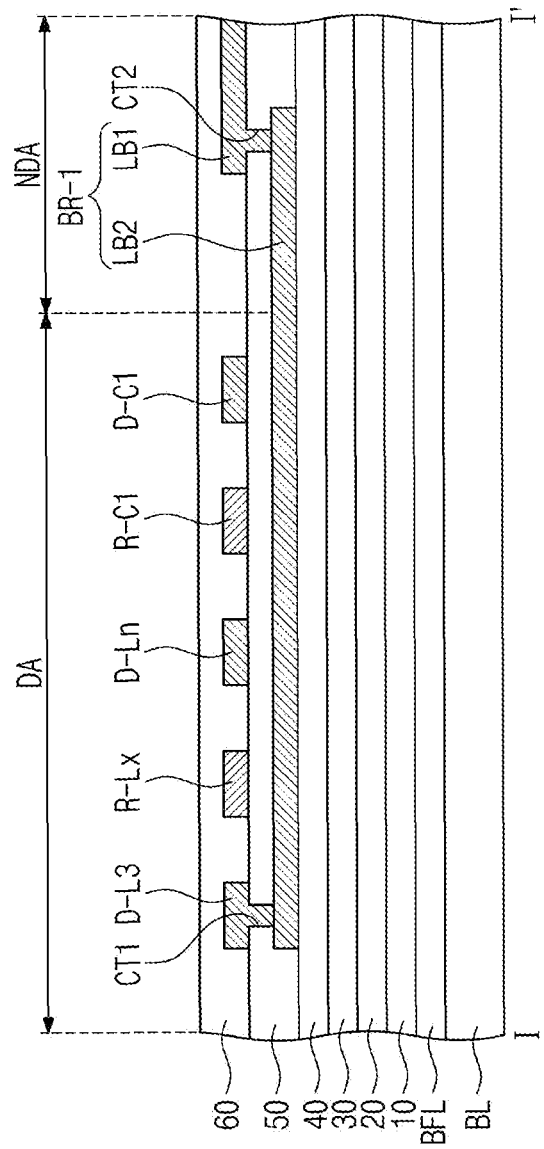
FIG. 9A is a cross-sectional view of a display panel taken along line I-I' of FIG. 8 according to an embodiment of the present disclosure.
Figure 9B:
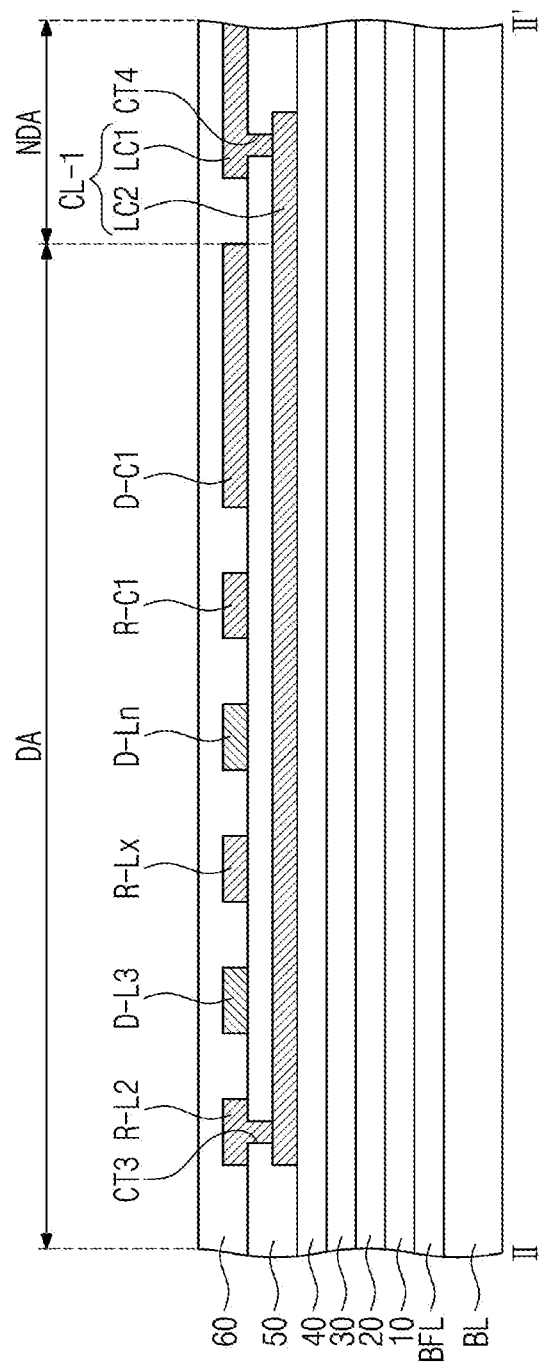
FIG. 9B is a cross-sectional view of a display panel taken along line II-II' of FIG. 8 according to an embodiment of the present disclosure.

FIG. 8 is a plan view of the display panel according to an embodiment of the present disclosure. FIG. 9A is a cross-sectional view taken along line I-I' of FIG. 8. FIG. 9B is a cross-sectional view taken along line II-II' of FIG. 8. FIG. 8 illustrates a planar arrangement relationship between the data lines and the readout lines described with reference to embodiments of FIGS. 3 to 6B.

Lines included in a data line DL to be described in an embodiment shown in FIG. 8 may correspond to the data lines DL1 to DLm described with reference to FIG. 3, and lines included in a readout line RL to be described in this embodiment may correspond to the readout lines RL1 to RLh described with reference to FIG. 3.

The display panel DP according to an embodiment may include a non-bending area NBA, a first bending area BA1, and a second bending area BA2. The non-bending area NBA may include the display area DA and a portion of the non-display area NDA, and the first bending area BA1 and the second bending area BA2 may include the remaining portions of the non-display area NDA, respectively.

The first bending area BA1 may be spaced apart from the second bending area BA2 in the first direction DR1 with the non-bending area NBA therebetween. First pads PD1 exposed from at least one of the first to seventh insulating layers 10 to 70 (refer to FIG. 7) and a data driver 200 may be disposed in the first bending area BA1. Corresponding lines of the data line DL may be connected to the first pads PD1.

Second pads PD2 exposed from at least one of the first to seventh insulating layers 10 to 70 (refer to FIG. 7) may be disposed in the second bending area BA2. Corresponding lines of the readout line RL may be connected to the second pads PD2. Corresponding circuit boards may be connected to the first pads PD1 and the second pads PD2.

In an embodiment, the first bending area BA1 and the second bending area BA2 may be bent toward the rear surface of the display panel DP. At this time, the circuit boards connected to the first bending area BA1 and the second bending area BA2 may be disposed to face the rear surface of the display panel DP.

The data line DL according to an embodiment of FIG. 8 may include a first data line group DL-1, a second data line group DL-2, and a third data line group DL-3. In addition, the data line DL may include bridge lines, such as first and second bridge lines BR-1 and BR-2.

The third data line group DL-3 may be disposed between the first data line group DL-1 and the second data line group DL-2 (e.g., in the second direction DR2). Accordingly, the first data line group DL-1 may be disposed on the left side with respect to the third data line group DL-3, and the second data line group DL-2 may be disposed on the right side with respect to the third data line group DL-3.

The first data line group DL-1 may include n first lines D-L1 to D-Ln in which n is a natural number that extend in the first direction DR1 and that are spaced apart from each other in the second direction DR2.

The second data line group DL-2 may include n second lines D-R1 to D-Rn that extend in the first direction DR1 and that are spaced apart from each other in the second direction DR2.

The third data line group DL-3 may include m third lines D-C1 to D-Cm in which m is a natural number that extend in the first direction DR1 and that are spaced apart from each other in the second direction DR2. In an embodiment, each of the third lines D-C1 to D-Cm may be directly connected to the data driver 200 and a corresponding one of the first pads PD1.

The first bridge lines BR-1 may be connected to the corresponding first lines D-L1 to D-Ln and the corresponding first pads PD1. Each of the first bridge lines BR-1 may include a first pattern LB1 and a second pattern LB2. The first pattern LB1 may extend in the first direction DR1 and may have one end connected to a corresponding one of the first pads PD1. The plurality of first patterns LB1 may be arranged to alternate with the first lines D-L1 to D-Ln in the second direction DR2.

The second pattern LB2 may extend in the second direction DR2 and may be connected to an opposite end of the first pattern LB1 and a corresponding one of the first lines D-L1 to D-Ln. According to an embodiment, the first lines D-L1 to D-Ln may be connected to the data driver 200 and the first pads PD1 through the first bridge lines BR-1.

The second bridge lines BR-2 may be connected to the corresponding second lines D-R1 to D-Rn and the corresponding first pads PD1. Each of the second bridge lines BR-2 may include a first pattern RB1 and a second pattern RB2. The first pattern RB1 may extend in the first direction DR1 and may have one end connected to a corresponding one of the first pads PD1. The plurality of first patterns RB1 may be arranged to alternate with the second lines D-R1 to D-Rn in the second direction DR2.

The second pattern RB2 may extend in the second direction DR2 and may be connected to an opposite end of the first pattern RB1 and a corresponding one of the second lines D-R1 to D-Rn. According to an embodiment, the second lines D-R1 to D-Rn may be connected to the data driver 200 and the first pads PD1 through the second bridge lines BR-2.

According to an embodiment, the second patterns LB2 and RB2 of the first and second bridge lines BR-1 and BR-2 may be disposed in the display area DA, and the first patterns LB1 and RB1 of the first and second bridge lines BR-1 and BR-2 may extend from the display area DA to the non-display area NDA and may be connected to the corresponding first pads PD1. Accordingly, the area of a first dead space DS1 in which lines for connecting the first and second data line groups DL-1 and DL-2 to the data driver 200 are disposed may be reduced. Thus, the display device DD (refer to FIG. 1) may have a narrow bezel.

The readout line RL according to an embodiment of FIG. 8 may include a first readout line group RL-1, a second readout line group RL-2, and a third readout line group RL-3. In addition, the readout line RL may include readout bridge lines CR-1 and CR-2.

The first readout line group RL-1 may include x fourth lines R-L1 to R-Lx in which x is a natural number that extend in the first direction DR1 and that are arranged to alternate with the first lines D-L1 to D-Ln in the second direction DR2.

The second readout line group RL-2 may include x fifth lines R-R1 to R-Rx in which x is a natural number that extend in the first direction DR1 and that are arranged to alternate with the second lines D-R1 to D-Rn in the second direction DR2.

The third readout line group RL-3 may include y sixth lines R-C1 to R-Cy in which y is a natural number that extend in the first direction DR1 and that are spaced apart from each other in the second direction DR2. Each of the sixth lines R-C1 to R-Cy may be directly connected to a corresponding one of the second pads PD2.

The first readout bridge lines CR-1 may be connected to the corresponding fourth lines R-L1 to R-Lx and the corresponding second pads PD2. Each of the first readout bridge lines CR-1 may include a third pattern LC1 and a fourth pattern LC2. The third pattern LC1 may extend in the first direction DR1 and may have one end connected to a corresponding one of the second pads PD2. The plurality of third patterns LC1 may be arranged to alternate with the fourth lines R-L1 to R-Lx in the second direction DR2.

The fourth pattern LC2 may extend in the second direction DR2 and may be connected to an opposite end of the third pattern LC1 and a corresponding one of the fourth lines R-L1 to R-Lx. According to an embodiment, the fourth lines R-L1 to R-Lx may be connected to the second pads PD2 through the first readout bridge lines CR-1.

The second readout bridge lines CR-2 may be connected to the corresponding fifth lines R-R1 to R-Rx and the corresponding second pads PD2. Each of the second readout bridge lines CR-2 may include a third pattern RC1 and a fourth pattern RC2. The third pattern RC1 may extend in the first direction DR1 and may have one end connected to a corresponding one of the second pads PD2. The plurality of third patterns RC1 may be arranged to alternate with the fifth lines R-R1 to R-Rx in the second direction DR2.

The fourth pattern RC2 may extend in the second direction DR2 and may be connected to an opposite end of the third pattern RC1 and a corresponding one of the fifth lines R-R1 to R-Rx. According to this embodiment, the fifth lines R-R1 to R-Rx may be connected to the second pads PD2 through the second readout bridge lines CR-2.

According to an embodiment, the fourth patterns LC2 and RC2 of the first and second readout bridge lines CR-1 and CR-2 may be disposed in the display area DA, and the third patterns LC1 and RC1 of the first and second readout bridge lines CR-1 and CR-2 may extend from the display area DA to the non-display area NDA and may be connected to the corresponding second pads PD2. Accordingly, the area of a second dead space DS2 in which lines for connecting the first and second readout line groups RL-1 and RL-2 to the second pads PD2 are disposed may be reduced. Thus, the display device DD may have a narrow bezel.

Referring to FIGS. 9A and 9B, in an embodiment, the first data line group DL-1, the second data line group DL-2, the third data line group DL-3, the first patterns LB1 and RB1, the first readout line group RL-1, the second readout line group RL-2, the third readout line group RL-3, and the third patterns LC1 and RC1 may be disposed on the same layer. For example, in an embodiment each of these lines may be disposed on the fifth insulating layer 50.

The second patterns LB2 and RB2 and the fourth patterns LC2 and RC2 may be disposed on the fourth insulating layer 40. For example, one end of the second pattern LB2 may be connected to the third line D-L3 among the first lines D-L1 to D-Ln through a first contact hole CT1 defined in the fifth insulating layer 50, and an opposite end of the second pattern LB2 may be connected to the first pattern LB1 through a second contact hole CT2 defined in the fifth insulating layer 50. One end of the fourth pattern LC2 may be connected to the second line R-L2 among the fourth lines R-L1 to R-Lx through a third contact hole CT3 defined in the fifth insulating layer 50, and an opposite end of the fourth pattern LC2 may be connected to the third pattern LC1 through a fourth contact hole CT4 defined in the fifth insulating layer 50.

As the second patterns LB2 and RB2 and the fourth patterns LC2 and RC2 extend in the second direction DR2, the second patterns LB2 and RB2 and the fourth patterns LC2 and RC2 may overlap one of the first lines D-L1 to D-Ln, the second lines D-R1 to D-Rn, the third lines D-C1 to D-Cm, the fourth lines R-L1 to R-Lx, the fifth lines R-R1 to R-Rx, and the first patterns LB1 and RB1.

In this embodiment, the readout line RL may perform different functions in the sensing section SS and the non-sensing section N-SS described with reference to FIG. 5C. The readout line RL may be connected to the readout circuit 500 (refer to FIG. 3). In the sensing section SS, the readout circuit 500 may receive sensing signals that are output from the readout line RL in response to the fourth control signal RCS (refer to FIG. 3). The readout circuit 500 may process the sensing signals received from the readout line RL and may provide the processed sensing signals S_FS (refer to FIG. 3) to the drive controller 100. The drive controller 100 may recognize biometric information based on the sensing signals S_FS.

As the lines included in the readout line RL in this embodiment are disposed on the entire surface of the display area DA with a predetermined gap therebetween, the sensing area of the display panel DP according to an embodiment may correspond to the entire region of the display area DA.

In the non-sensing section N-SS, the readout line RL may receive the reference voltage Vdc. For example, the readout line RL may receive the reference voltage Vdc from the readout circuit 500 in response to a control signal. In an embodiment, the reference voltage Vdc may be the first drive voltage ELVDD or the second drive voltage ELVSS. However, the reference voltage Vdc is not necessarily limited thereto as long as the reference voltage Vdc is a DC voltage applied to the pixel drive circuit R_PD or the sensor drive circuit O_SD.

Each of the fourth lines R-L1 to R-Lx included in the first readout line group RL-1 may be spaced apart from the first pattern LB1 in the second direction DR2. Each of the fifth lines R-R1 to R-Rx included in the second readout line group RL-2 may be spaced apart from the first pattern RB1 in the second direction DR2.

The lines included in the first readout line group RL-1 and the second readout line group RL-2 may be shorter in the first direction DR1 than the lines included in the third readout line group RL-3. For example, the sixth lines R-C1 to R-Cy overlapping the first patterns LB1 and RB1 in the first direction DR1 may be longer in the first direction DR1 than the fourth lines R-L1 to R-Lx and the fifth lines R-R1 to R-Rx.

As illustrated in FIG. 9A, one fourth line R-Lx among the fourth lines R-L1 to R-Lx may be disposed between the adjacent first lines D-L1 to D-Ln. In the sensing section SS (refer to FIG. 5C), the fourth line R-Lx may output a sensing signal. In the non-sensing section N-SS (refer to FIG. 5C), the fourth line R-Lx may receive the reference voltage Vdc.

As the display panel DP includes the fourth lines R-L1 to R-Lx having an arrangement shape similar to the arrangement shape of the first lines D-L1 to D-Ln and receiving the reference voltage Vdc (refer to FIG. 3) in the non-sensing section N-SS (refer to FIG. 5C), a noise phenomenon caused by the first bridge lines BR-1 may be decreased even though the first lines D-L1 to D-Ln are connected to the first pads PD1 through the first bridge lines BR-1. This effect may be identically applied to the fifth lines R-R1 to R-Rx arranged to alternate with the second lines D-R1 to D-Rn in the second directions DR2.

According to an embodiment of the present disclosure, the display panel DP having a narrow bezel may be provided through the bridge lines BR-1, BR-2, CR-1, and CR-2. In addition, as the readout line RL outputs a sensing signal in the sensing section SS and receives the reference voltage Vdc (refer to FIG. 3) in the non-sensing section N-SS, the display device DD (refer to FIG. 1) including the display panel DP with reduced noise may be provided.

Figure 10:
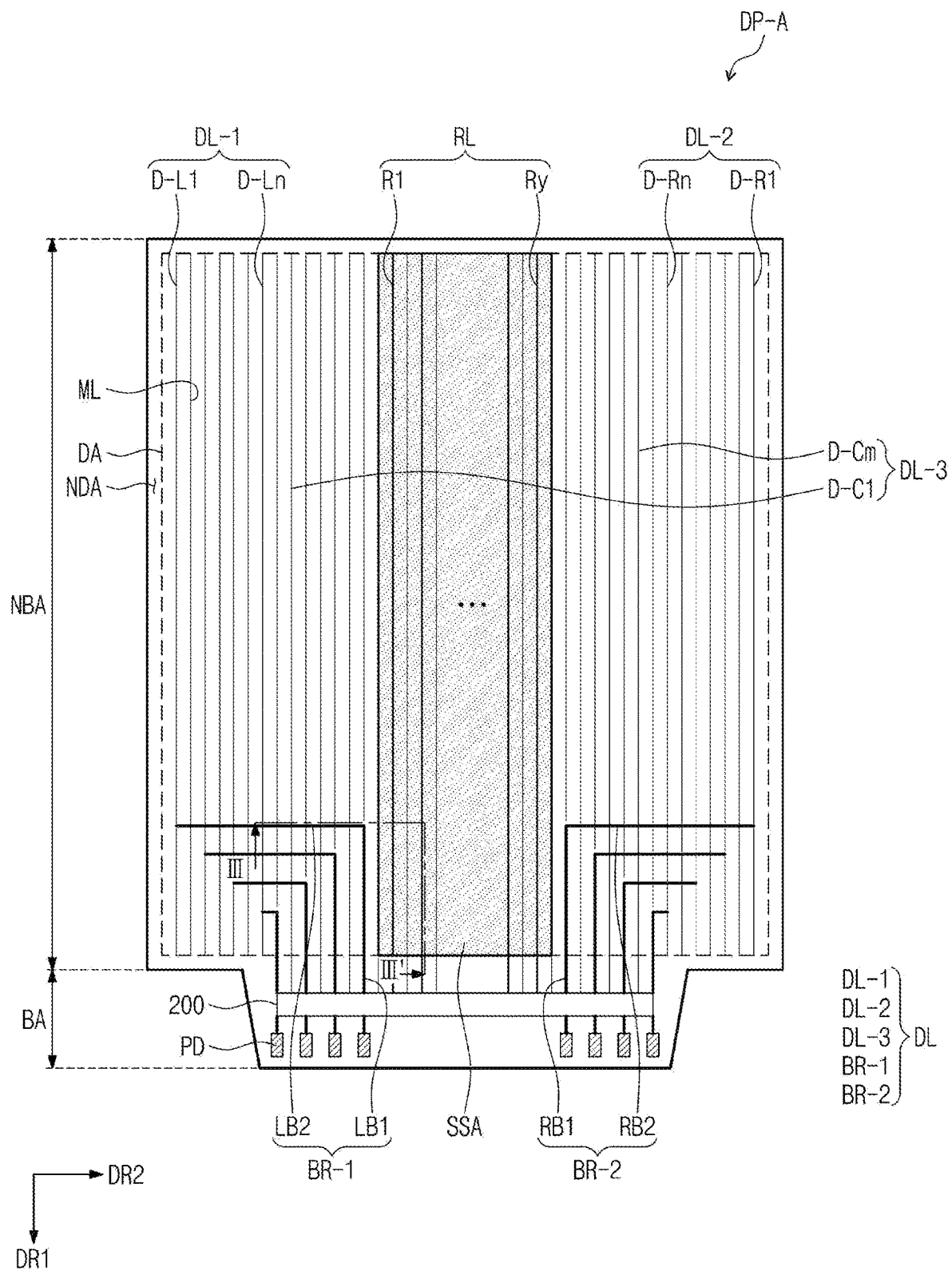
FIG. 10 is a plan view of a display panel according to an embodiment of the present disclosure.
Figure 11:
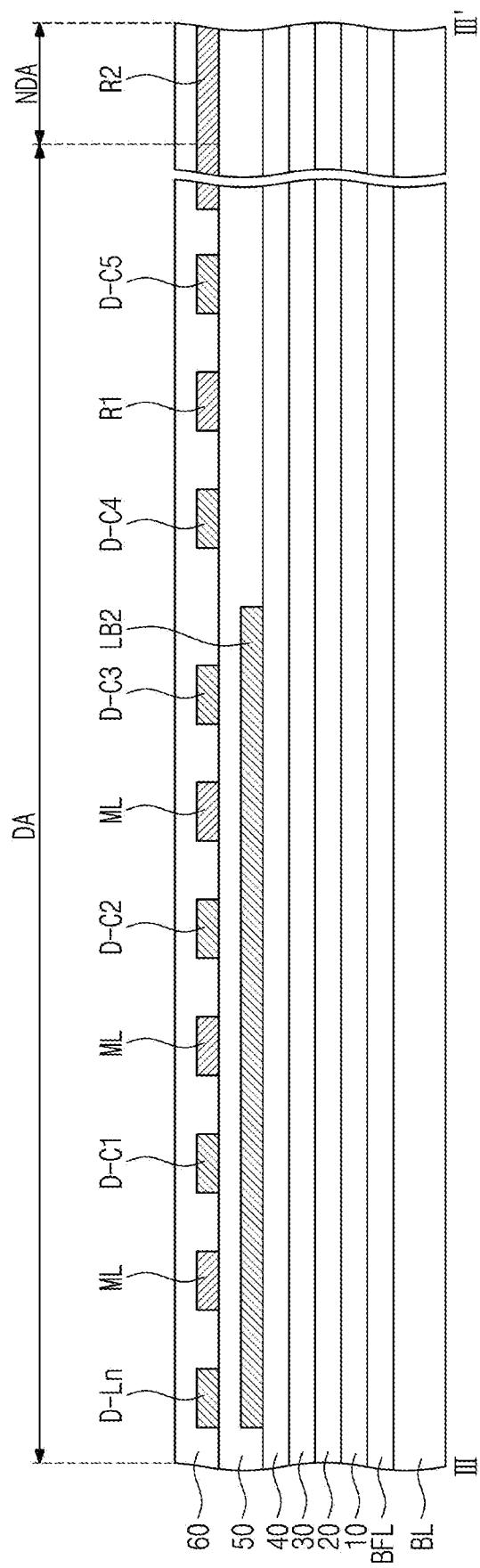
FIG. 11 is a cross-sectional view of a display panel taken along line III-III' of FIG. 10 according to an embodiment of the present disclosure.

FIG. 10 is a plan view of a display panel according to an embodiment of the present disclosure. FIG. 11 is a cross-sectional view taken along line III-III' of FIG. 10. Identical or similar reference numerals may be used to refer to components identical or similar to the components described with reference to FIGS. 1 to 9B, and repetitive descriptions will be omitted for economy of description. FIG. 10 illustrates a planar arrangement relationship between the data lines and the readout lines described with reference to FIGS. 3 to 6B.

Lines included in a data line DL to be described in this embodiment may correspond to the data lines DL1 to DLm described with reference to FIG. 3, and lines included in a readout line RL to be described in this embodiment may correspond to the readout lines RL1 to RLh described with reference to FIG. 3.

The display panel DP-A according to an embodiment of FIG. 10 may include a non-bending area NBA and a bending area BA. The non-bending area NBA may include a display area DA and a portion of a non-display area NDA, and the bending area BA may include the remaining portion of the non-display area NDA.

The non-bending area NBA may be arranged in the first direction DR1 with the bending area BA. Pads PD exposed from at least one of the first to seventh insulating layers 10 to 70 (refer to FIG. 7) may be disposed in the bending area BA. Corresponding lines of the data line DL may be connected to the pads PD.

The bending area BA may be bent toward the rear surface of the display panel DP-A. At this time, a circuit board connected to the bending area BA may be disposed to face the rear surface of the display panel DP-A.

The data line DL according to an embodiment may include a first data line group DL-1, a second data line group DL-2, and a third data line group DL-3. In addition, the data line DL may include bridge lines BR-1 and BR-2. The first data line group DL-1 may be disposed on the left side with respect to the third data line group DL-3, and the second data line group DL-2 may be disposed on the right side with respect to the third data line group DL-3.

The first data line group DL-1 may include n first lines D-L1 to D-Ln in which n is a natural number that extend in the first direction DR1 and that are spaced apart from each other in the second direction DR2.

The second data line group DL-2 may include n second lines D-R1 to D-Rn in which n is a natural number that extend in the first direction DR1 and that are spaced apart from each other in the second direction DR2.

The third data line group DL-3 may include m third lines D-C1 to D-Cm in which m is a natural number that extend in the first direction DR1 and that are spaced apart from each other in the second direction DR2. Each of the third lines D-C1 to D-Cm may be directly connected to a data driver 200 and a corresponding one of the pads PD.

The first bridge lines BR-1 may be connected to the corresponding first lines D-L1 to D-Ln and the corresponding pads PD. Each of the first bridge lines BR-1 may include a first pattern LB1 and a second pattern LB2. The first pattern LB1 may extend in the first direction DR1 and may have one end connected to a corresponding one of the pads PD. The plurality of first patterns LB1 may be arranged to alternate with the first lines D-L1 to D-Ln in the second direction DR2.

The second pattern LB2 may extend in the second direction DR2 and may be connected to an opposite end of the first pattern LB1 and a corresponding one of the first lines D-L1 to D-Ln. According to an embodiment, the first lines D-L1 to D-Ln may be connected to the data driver 200 and the pads PD through the first bridge lines BR-1.

The second bridge lines BR-2 may be connected to the corresponding second lines D-R1 to D-Rn and the corresponding pads PD. Each of the second bridge lines BR-2 may include a first pattern RB1 and a second pattern RB2. The first pattern RB1 may extend in the first direction DR1 and may have one end connected to a corresponding one of the pads PD. The plurality of first patterns RB1 may be arranged to alternate with the second lines D-R1 to D-Rn in the second direction DR2.

The second pattern RB2 may extend in the second direction DR2 and may be connected to an opposite end of the first pattern RB1 and a corresponding one of the second lines D-R1 to D-Rn. According to an embodiment, the second lines D-R1 to D-Rn may be connected to the data driver 200 and the pads PD through the second bridge lines BR-2.

The readout line RL may include y sixth lines R1 to Ry in which y is a natural number that extend in the first direction DR1 and that are spaced apart from each other in the second direction DR2. Each of the sixth lines R1 to Ry may be directly connected to a corresponding one of the pads PD. The sixth lines R1 to Ry may be arranged to alternate with the third lines D-C1 to D-Cm in the second direction DR2. Accordingly, in an embodiment, the readout line RL may be disposed between the first data line group DL-1 and the second data line group DL-2 (e.g., in the second direction DR2).

The display panel DP-A according to an embodiment may further include dummy lines ML. The dummy lines ML may extend in the first direction DR1 and may be spaced apart from each other in the second direction DR2. One dummy line ML may be disposed between the adjacent first lines D-L1 to D-Ln and between the adjacent second lines D-R1 to D-Rn.

Referring to FIG. 11, in an embodiment the first data line group DL-1, the second data line group DL-2, the third data line group DL-3, the first patterns LB1 and RB1, the readout line RL, and the dummy lines ML may be disposed on the same layer. For example, the lines may be disposed on the fifth insulating layer 50.

In an embodiment, the readout line RL may perform different functions in the sensing section SS and the non-sensing section N-SS described with reference to FIG. 5C. The readout line RL may be connected to the readout circuit 500 (refer to FIG. 3). In the sensing section SS, the readout circuit 500 may receive sensing signals from the readout line RL in response to the fourth control signal RCS (refer to FIG. 3). The readout circuit 500 may process the sensing signals received from the readout line RL and may provide the processed sensing signals S_FS (refer to FIG. 3) to the drive controller 100 (refer to FIG. 3). The drive controller 100 may recognize biometric information based on the sensing signals S_FS.

In an embodiment, the sixth lines R1 to Ry included in the readout line RL may be disposed only in a partial region of the display area DA. For example, in an embodiment the area where the readout line RL is disposed may be less than the area where the third data line group DL-3 is disposed. Accordingly, a sensing area SSA of the display panel DP-A may have a smaller area than the display area DA.

In the non-sensing section N-SS, the readout line RL may receive the reference voltage Vdc (refer to FIG. 3). In an embodiment, the reference voltage Vdc may be the first drive voltage ELVDD or the second drive voltage ELVSS. However, the reference voltage Vdc is not necessarily limited to any one voltage as long as the reference voltage Vdc is a DC voltage applied to the pixel drive circuit R_PD or the sensor drive circuit O_SD.

In an embodiment, the dummy lines ML may receive the reference voltage Vdc. The reference voltage Vdc provided to the dummy lines ML may be the same as the reference voltage Vdc provided to the readout line RL in the non-sensing section N-SS.

Each of the dummy lines ML disposed between the first lines D-L1 to D-Ln may be spaced apart from the first pattern LB1 in the second direction DR2 and may be aligned with the first pattern LB1 in the first direction DR1. Each of the dummy lines ML disposed between the second lines D-R1 to D-Rn may be spaced apart from the first pattern RB1 in the second direction DR2 and may be aligned with the first pattern RB1 in the first direction DR1.

As the display panel DP-A includes the dummy lines ML having an arrangement shape similar to the arrangement shape of the first lines D-L1 to D-Ln and receiving the reference voltage Vdc (refer to FIG. 3), a noise phenomenon caused by the first bridge lines BR-1 may be decreased even though the first lines D-L1 to D-Ln are connected to the pads PD through the first bridge lines BR-1. This effect may be identically applied to the fifth lines R-R1 to R-Rx arranged to alternate with the second lines D-R1 to D-Rn in the second directions DR2.

Figure 12:
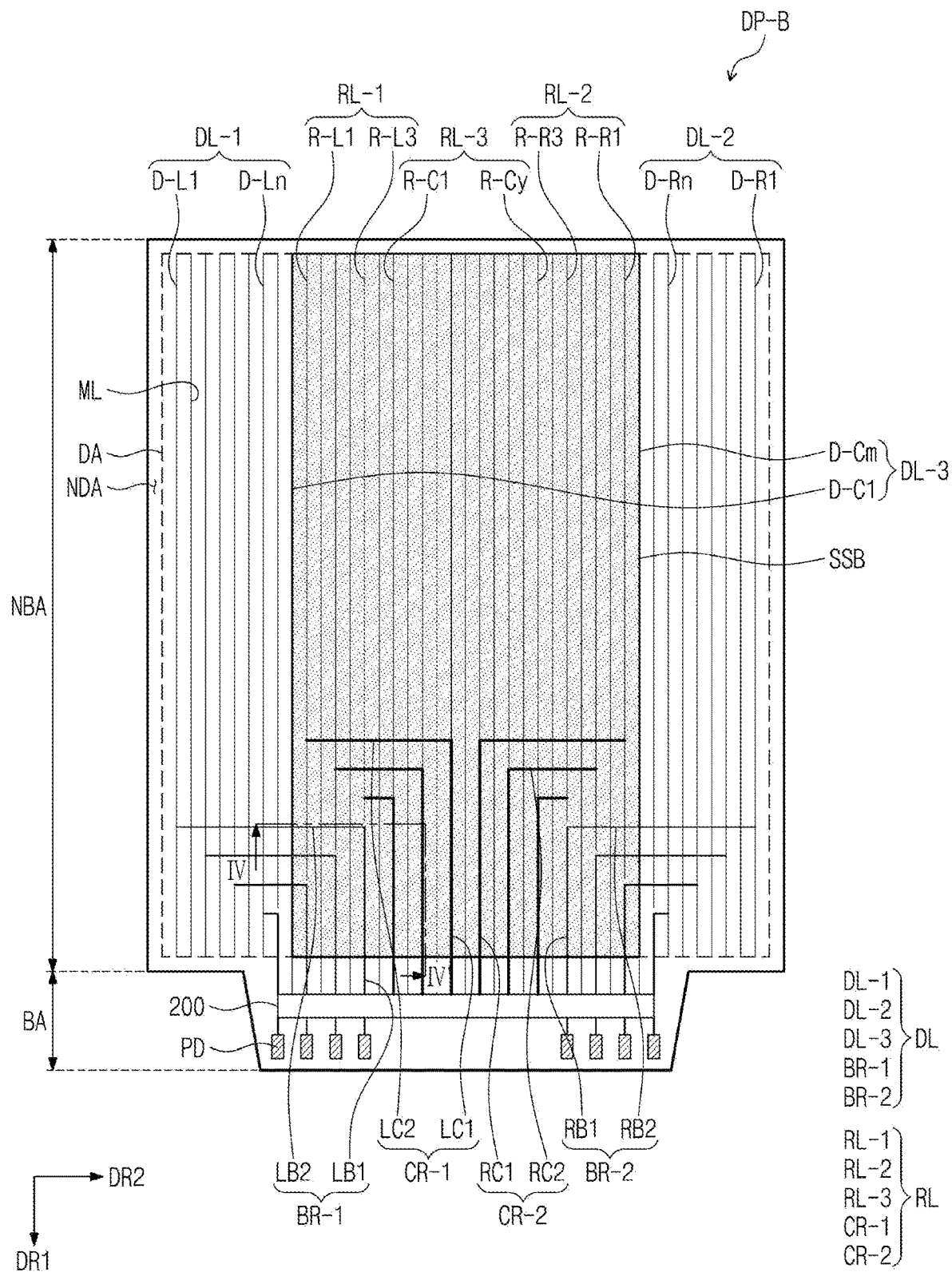
FIG. 12 is a plan view of a display panel according to an embodiment of the present disclosure.
Figure 13:
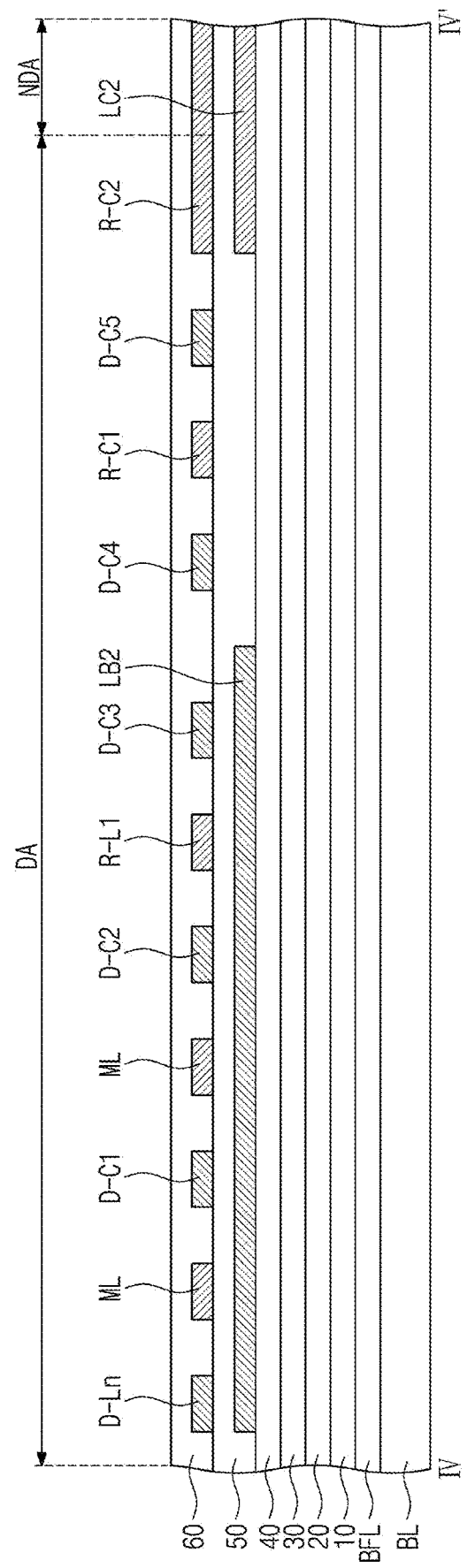
FIG. 13 is a cross-sectional view of a display panel taken along line IV-IV' of FIG. 12 according to an embodiment of the present disclosure.

FIG. 12 is a plan view of a display panel according to an embodiment of the present disclosure. FIG. 13 is a cross-sectional view taken along line IV-IV' of FIG. 12. Identical or similar reference numerals may be used to refer to components identical or similar to the components described with reference to FIGS. 1 to 11, and repetitive descriptions will be omitted. FIG. 12 illustrates a planar arrangement relationship between the data lines and the readout lines described with reference to FIGS. 3 to 6B.

Lines included in a data line DL to be described in this embodiment may correspond to the data lines DL1 to DLm described with reference to FIG. 3, and lines included in a readout line RL to be described in this embodiment may correspond to the readout lines RL1 to RLh described with reference to FIG. 3.

The display panel DP-B according to an embodiment of FIG. 12 may include a non-bending area NBA and a bending area BA. The non-bending area NBA may include a display area DA and a portion of a non-display area NDA, and the bending area BA may include the remaining portion of the non-display area NDA.

The non-bending area NBA may be arranged in the first direction DR1 with the bending area BA. Pads PD exposed from at least one of the first to seventh insulating layers 10 to 70 (refer to FIG. 7) may be disposed in the bending area BA. Corresponding lines of the data line DL may be connected to the pads PD.

The bending area BA may be bent toward the rear surface of the display panel DP-B so that the circuit boards may be disposed to face the rear surface of the display panel DP-B.

The data line DL according to an embodiment may include a first data line group DL-1, a second data line group DL-2, and a third data line group DL-3. In addition, the data line DL may include bridge lines, such as first and second bridge lines BR-1 and BR-2. The first data line group DL-1 may be disposed on the left side with respect to the third data line group DL-3, and the second data line group DL-2 may be disposed on the right side with respect to the third data line group DL-3.

The first data line group DL-1 may include n first lines D-L1 to D-Ln in which n is a natural number that extend in the first direction DR1 and that are spaced apart from each other in the second direction DR2.

The second data line group DL-2 may include n second lines D-R1 to D-Rn in which n is a natural number that extend in the first direction DR1 and that are spaced apart from each other in the second direction DR2.

The third data line group DL-3 may include m third lines D-C1 to D-Cm in which m is a natural number that extend in the first direction DR1 and that are spaced apart from each other in the second direction DR2. Each of the third lines D-C1 to D-Cm may be directly connected to a data driver 200 and a corresponding one of the pads PD.

The first bridge lines BR-1 may be connected to the corresponding first lines D-L1 to D-Ln and the corresponding pads PD. Each of the first bridge lines BR-1 may include a first pattern LB1 and a second pattern LB2. The first pattern LB1 may extend in the first direction DR1 and may have one end connected to a corresponding one of the pads PD. The plurality of first patterns LB1 may be arranged to alternate with the first lines D-L1 to D-Ln in the second direction DR2.

The second pattern LB2 may extend in the second direction DR2 and may be connected to an opposite end of the first pattern LB1 and a corresponding one of the first lines D-L1 to D-Ln. According to an embodiment, the first lines D-L1 to D-Ln may be connected to the data driver 200 and the pads PD through the first bridge lines BR-1.

The second bridge lines BR-2 may be connected to the corresponding second lines D-R1 to D-Rn and the corresponding pads PD. Each of the second bridge lines BR-2 may include a first pattern RB1 and a second pattern RB2. The first pattern RB1 may extend in the first direction DR1 and may have one end connected to a corresponding one of the pads PD. The plurality of first patterns RB1 may be arranged to alternate with the second lines D-R1 to D-Rn in the second direction DR2.

The second pattern RB2 may extend in the second direction DR2 and may be connected to an opposite end of the first pattern RB1 and a corresponding one of the second lines D-R1 to D-Rn. According to an embodiment, the second lines D-R1 to D-Rn may be connected to the data driver 200 and the pads PD through the second bridge lines BR-2.

The readout line RL according to an embodiment may include a first readout line group RL-1, a second readout line group RL-2, and a third readout line group RL-3. In addition, the readout line RL may include readout bridge lines, such as first and second readout bridge lines CR-1 and CR-2.

In an embodiment, the first readout line group RL-1 may include three fourth lines R-L1 to R-L3 that extend in the first direction DR1 and that are arranged to alternate with the third lines D-C1 to D-Cm in the second direction DR2. However, the number of fourth lines R-L1 to R-L3 is illustrative and embodiments of the present disclosure are not necessarily limited thereto. For example, the number of the fourth lines R-L1 to R-L3 may be varied.

The second readout line group RL-2 may include three fifth lines R-R1 to R-R3 that extend in the first direction DR1 and that are arranged to alternate with the third lines D-C1 to D-Cm in the second direction DR2. However, the number of fifth lines R-R1 to R-R3 is illustrative and embodiments of the present disclosure are not necessarily limited thereto. For example, the number of the fifth lines R-R1 to R-R3 may be varied.

The third readout line group RL-3 may include y sixth lines R-C1 to R-Cy in which y is a natural number that extend in the first direction DR1 and that are spaced apart from each other in the second direction DR2. The sixth lines R-C1 to R-Cy may be arranged to alternate with the third lines D-C1 to D-Cm in the second direction DR2. Each of the sixth lines R-C1 to R-Cy may be directly connected to a corresponding one of the pads PD.

The first readout bridge lines CR-1 may be connected to the corresponding fourth lines R-L1 to R-L3 and the corresponding pads PD. Each of the first readout bridge lines CR-1 may include a third pattern LC1 and a fourth pattern LC2. The third pattern LC1 may extend in the first direction DR1 and may have one end connected to a corresponding one of the pads PD. The plurality of third patterns LC1 may be arranged to alternate with the fourth lines R-L1 to R-L3 in the second direction DR2.

The fourth pattern LC2 may extend in the second direction DR2 and may be connected to an opposite end of the third pattern LC1 and a corresponding one of the fourth lines R-L1 to R-L3. According to an embodiment, the fourth lines R-L1 to R-L3 may be connected to the pads PD through the first readout bridge lines CR-1.

The second readout bridge lines CR-2 may be connected to the corresponding fifth lines R-R1 to R-R3 and the corresponding pads PD. Each of the second readout bridge lines CR-2 may include a third pattern RC1 and a fourth pattern RC2. The third pattern RC1 may extend in the first direction DR1 and may have one end connected to a corresponding one of the pads PD. The plurality of third patterns RC1 may be arranged to alternate with the fifth lines R-R1 to R-R3 in the second direction DR2.

The fourth pattern RC2 may extend in the second direction DR2 and may be connected to an opposite end of the third pattern RC1 and a corresponding one of the fifth lines R-R1 to R-R3. According to an embodiment, the fifth lines R-R1 to R-R3 may be connected to the pads PD through the second readout bridge lines CR-2.

Each of the third patterns LC1 and RC1 may be disposed between the adjacent third lines D-C1 to D-Cm. The third patterns LC1 and RC1 may overlap the sixth lines R-C1 to R-Cy and may be disposed on a different layer from the sixth lines R-C1 to R-Cy. For example, the third patterns LC1 and RC1 may be disposed on the fourth insulating layer 40, and the sixth lines R-C1 to R-Cy may be disposed on the fifth insulating layer 50.

According to an embodiment, the first readout line group RL-1 and the second readout line group RL-2 may be connected to the pads PD disposed on the same side as the data line DL through the first and second readout bridge lines CR-1 and CR-2. Accordingly, the display panel DP-B in which the second bending area BA2 of the non-display area NDA is reduced when compared to that in the display panel DP of FIG. 8 may be provided.

Furthermore, according to an embodiment, the sixth lines R-C1 to R-Cy may be disposed only in a partial region of the display area DA. For example, the area where the readout line RL is disposed may be similar to the area where the third data line group DL-3 is disposed. Accordingly, a sensing area SSB of the display panel DP-B may have a smaller area than the display area DA.

The display panel DP-B according to an embodiment may further include dummy lines ML. The dummy lines ML may extend in the first direction DR1 and may be spaced apart from each other in the second direction DR2. One dummy line ML may be disposed between the adjacent first lines D-L1 to D-Ln and between the adjacent second lines D-R1 to D-Rn.

In an embodiment, the dummy lines ML may receive the reference voltage Vdc. The reference voltage Vdc provided to the dummy lines ML may be the same as the reference voltage Vdc provided to the readout line RL in the non-sensing section N-SS.

According to embodiments of the present disclosure, the bridge lines may be connected with the data lines and may be at least partially disposed in the display area, and thus the display device may have the display panel with a narrow bezel. In addition, the readout line may output the sensing signal in the sensing section and may receive the reference voltage in the non-sensing section, and thus the display device may have the display panel with reduced noise.

While the present disclosure has been described with reference to non-limiting embodiments thereof, it will be apparent to those of ordinary skill in the art that various changes and modifications may be made thereto without departing from the spirit and scope of the present disclosure.

What is claimed is:

1. A display device comprising:
a base layer;
a circuit layer disposed on the base layer, the circuit layer including at least one insulating layer and at least one transistor; and
an element layer disposed on the circuit layer, the element layer including a light emitting element and a light sensing element,
wherein the circuit layer includes:
a data line connected to the light emitting element; and
a readout line connected to the light sensing element,
wherein the readout line outputs a sensing signal in a sensing section of the display device, and
wherein the readout line receives a reference voltage in a non-sensing section of the display device.

2. The display device of claim 1, further comprising:
a readout circuit connected with the readout line, the readout circuit receiving the sensing signal in the sensing section,
wherein the readout circuit includes a switching circuit applying the reference voltage to the readout line in the non-sensing section in response to a control signal.

3. The display device of claim 2, wherein:
the at least one transistor is connected to the light emitting element;
a first drive voltage is applied to the at least one transistor connected to the light emitting element,
wherein a second drive voltage having a lower voltage level than the first drive voltage is applied to the light emitting element and the light sensing element, and
wherein the reference voltage is one of the first drive voltage and the second drive voltage.

4. The display device of claim 1, wherein:
the base layer includes a non-bending area, and a first bending area and a second bending area spaced apart from each other in a first direction with the non-bending area positioned therebetween; and
the circuit layer includes first pads disposed in the first bending area, the first pads are exposed by the at least one insulating layer, and second pads disposed in the second bending area, the second pads are exposed by the at least one insulating layer.

5. The display device of claim 4, wherein the data line includes:
a first data line group including n first lines extending in the first direction and spaced apart from each other in a second direction crossing the first direction, wherein n is a natural number;
a second data line group including n second lines extending in the first direction and spaced apart from each other in the second direction;
a third data line group disposed between the first data line group and the second data line group, the third data line group including m third lines extending in the first direction and spaced apart from each other in the second direction, wherein m is a natural number; and
bridge lines connected to corresponding lines among the first lines and the second lines,
wherein the first data line group and the second data line group are connected to corresponding pads among the first pads through the bridge lines, and the third data line group is directly connected to corresponding pads among the first pads.

6. The display device of claim 5, wherein each of the bridge lines includes:
a first pattern extending in the first direction and having a first end connected to a corresponding pad among the first pads; and
a second pattern extending in the second direction and connected to an opposite second end of the first pattern and a corresponding line among the first lines and the second lines.

7. The display device of claim 5, wherein the readout line includes:
a first readout line group including x fourth lines extending in the first direction and alternately arranged with the first lines in the second direction, wherein x is a natural number;
a second readout line group including x fifth lines extending in the first direction and alternately arranged with the second lines in the second direction;
a third readout line group including y sixth lines extending in the first direction and alternately arranged with the third lines in the second direction, wherein y is a natural number; and
readout bridge lines connected to corresponding lines among the fourth lines and the fifth lines,
wherein the first readout line group and the second readout line group are connected to corresponding pads among the second pads through the readout bridge lines, and the third readout line group is directly connected to corresponding pads among the second pads.

8. The display device of claim 7, wherein each of the readout bridge lines includes a third pattern extending in the first direction and having a first end connected to a corresponding pad among the second pads and a fourth pattern extending in the second direction and connected to an opposite second end of the third pattern and a corresponding line among the fourth lines and the fifth lines.

9. The display device of claim 8, wherein the third pattern overlaps one of the first lines and the second lines.

10. The display device of claim 8, wherein the fourth pattern crosses at least one of the first lines and the second lines and is disposed on a different layer from the first lines and the second lines.

11. The display device of claim 1, wherein the base layer includes a non-bending area and a bending area adjacent to the non-bending area,
wherein the circuit layer includes pads disposed in the bending area, the pads are exposed by the at least one insulating layer.

12. The display device of claim 11, wherein the data line includes:
a first data line group including n first lines extending in a first direction and spaced apart from each other in a second direction crossing the first direction, wherein n is a natural number;
a second data line group including n second lines extending in the first direction and spaced apart from each other in the second direction;
a third data line group disposed between the first data line group and the second data line group, the third data line group including m third lines extending in the first direction and spaced apart from each other in the second direction, wherein m is a natural number; and
bridge lines connected to corresponding lines among the first lines and the second lines,
wherein the first data line group and the second data line group are connected to corresponding pads among the pads through the bridge lines, and the third data line group is directly connected to corresponding pads among the pads.

13. The display device of claim 12, wherein the readout line includes y sixth lines extending in the first direction and directly connected with corresponding pads among the pads, the sixth lines are alternately arranged with the third lines in the second direction, wherein y is a natural number.

14. The display device of claim 13, further comprising:
dummy lines extending in the first direction and alternately arranged with the first lines and the second lines in the second direction.

15. The display device of claim 14, wherein the dummy lines receive the reference voltage.

16. The display device of claim 14, wherein the dummy lines are disposed on a same layer as the first data line group, the second data line group, the third data line group, and the sixth lines.

17. The display device of claim 13, wherein the readout line further includes:
a first readout line group including x fourth lines extending in the first direction and alternately arranged with the first lines in the second direction, wherein x is a natural number;
a second readout line group including x fifth lines extending in the first direction and alternately arranged with the second lines in the second direction; and
readout bridge lines connected to corresponding lines among the fourth lines and the fifth lines.

18. The display device of claim 17, wherein each of the readout bridge lines includes a third pattern extending in the first direction and having a first end connected to a corresponding pad among the pads and a fourth pattern extending in the second direction and connected to an opposite second end of the third pattern and a corresponding line among the fourth lines and the fifth lines.

19. The display device of claim 18, wherein the fourth pattern crosses at least one of the first lines and the second lines and is disposed on a different layer from the first lines and the second lines.

20. The display device of claim 1, wherein:
the circuit layer further includes a sensor drive circuit connected to the light sensing element; and
the sensor drive circuit includes:
a reset transistor including a first electrode receiving a reset voltage, a second electrode connected with a first sensing node, and a third electrode receiving a reset control signal;
an amplifying transistor including a first electrode receiving a sensor drive voltage, a second electrode connected with a second sensing node, and a third electrode connected with the first sensing node; and
an output transistor including a first electrode connected with the second sensing node, a second electrode connected with the readout line, and a third electrode receiving an output control signal.

* * * * *